US009287475B2

(12) United States Patent
Andrews et al.

(10) Patent No.: US 9,287,475 B2
(45) Date of Patent: Mar. 15, 2016

(54) SOLID STATE LIGHTING COMPONENT PACKAGE WITH REFLECTIVE POLYMER MATRIX LAYER

(75) Inventors: Peter Andrews, Durham, NC (US); Joseph Clark, Raleigh, NC (US); Harsh Sundani, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/554,628

(22) Filed: Jul. 20, 2012

(65) Prior Publication Data
US 2014/0021493 A1   Jan. 23, 2014

(51) Int. Cl.
H01L 29/18    (2006.01)
H01L 33/60    (2010.01)
H01L 33/58    (2010.01)
H01L 25/16    (2006.01)

(52) U.S. Cl.
CPC .............. *H01L 33/60* (2013.01); *H01L 25/167* (2013.01); *H01L 33/58* (2013.01); *H01L 2224/48091* (2013.01); *H01L 2224/73265* (2013.01); *H01L 2933/0091* (2013.01)

(58) Field of Classification Search
USPC ......... 257/88, 98, E27.121, E33.06, E33.068; 438/27
See application file for complete search history.

(56) References Cited

U.S. PATENT DOCUMENTS

| | | | |
|---|---|---|---|
| 6,921,926 B2 | 7/2005 | Hsu | |
| 7,521,728 B2 | 4/2009 | Andrews | |
| 7,910,938 B2 | 3/2011 | Hussell et al. | |
| 8,125,137 B2 | 2/2012 | Medendorp et al. | |
| 2004/0095658 A1* | 5/2004 | Buretea et al. | 359/853 |
| 2004/0178509 A1* | 9/2004 | Yoshino et al. | 257/780 |
| 2010/0073925 A1* | 3/2010 | Vissenberg et al. | 362/235 |
| 2010/0219430 A1* | 9/2010 | Wu | 257/91 |
| 2010/0252851 A1* | 10/2010 | Emerson et al. | 257/98 |
| 2011/0049545 A1 | 3/2011 | Basin et al. | |
| 2011/0108862 A1* | 5/2011 | Horng et al. | 257/88 |
| 2011/0248287 A1 | 10/2011 | Yuan et al. | |
| 2012/0097986 A1* | 4/2012 | Ku et al. | 257/88 |
| 2012/0098006 A1* | 4/2012 | Chen et al. | 257/98 |

OTHER PUBLICATIONS

Andrews, Peter, U.S. Appl. No. 13/017,778, Solid State Lighting Component Package with Reflective Layer, filed Jan. 31, 2011.

* cited by examiner

*Primary Examiner* — Matthew Gordon
(74) *Attorney, Agent, or Firm* — Christopher J. Knors; Moore & Van Allen PLLC

(57) ABSTRACT

A solid state lighting component comprising a layer having high reflectivity and/or scattering properties, the layer positioned about a solid state lighting component, and manufacturing methods of making same is disclosed. A method of increasing the luminous flux of the solid state lighting component, is also provided.

20 Claims, 16 Drawing Sheets

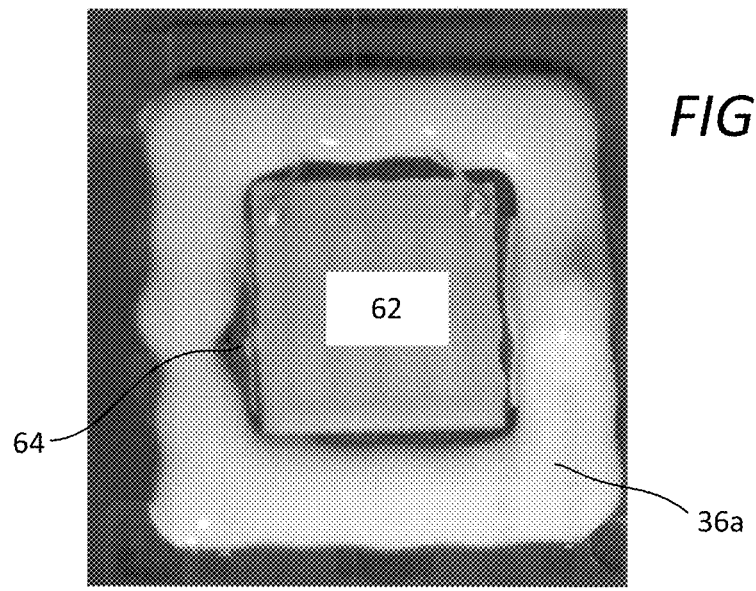
FIG. 11A
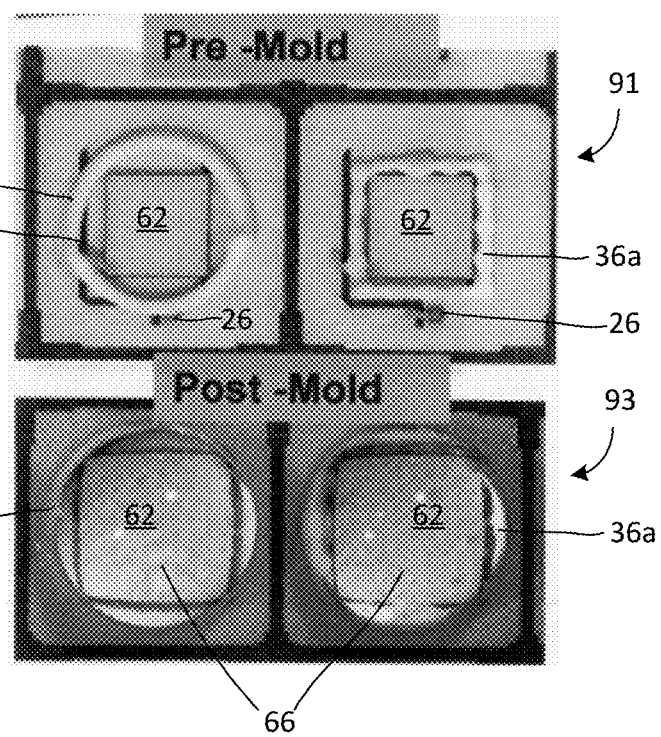
FIG. 11B
FIG. 11C

SOLID STATE LIGHTING COMPONENT PACKAGE WITH REFLECTIVE POLYMER MATRIX LAYER

TECHNICAL FIELD

The present disclosure relates to a solid state lighting component and a manufacturing method thereof, and more specifically, to a solid state lighting component comprising a scattering and/or reflecting layer arranged about the solid state lighting component.

BACKGROUND

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, electrostatic discharge devices, contacts, solder mask, and/or traces for electrically connecting the LED package to an external circuit.

LED arrays may be less compact than desired, as they include extended non-light emitting "dead space" between adjacent LEDs. This dead space can result in larger devices, and can provide for non-light emitting structures that can absorb light and reduce the total luminous flux of the LED package. This presents challenges in providing a compact LED lamp structure incorporating an LED component that delivers light at high efficiency. Moreover, to achieve desired beam shapes, individual optical lenses are typically mounted with each LED component, or very large reflectors (larger than the form of existing conventional sources) have to be employed. These secondary optical elements (lenses or reflectors) are large and costly, and any light being reflected from the sidewalls in the packages and cavities can also result in additional optical losses, making these overall LED components less efficient. As a result, the luminance of a LED package is significantly affected by its package structure.

It is also generally observed that LED's perform best when operating temperatures are minimized. Thus, it is generally desirable to remove heat from the LED, typically by heat transfer via the substrate. One of the best ceramic substrates for heat transfer is aluminum nitride (AlN). However, with AlN as a heat transfer material in a LED package, a dark brown color results upon deposition, which absorbs visible light and reduces the total luminous flux of the package. Conventional technology is to cover as much of the heat transfer material and/or dead space areas with reflective metal, or with white soldermask to maximize reflectivity while at the same time providing heat transfer. Unfortunately, metal cannot be applied everywhere in high density LED packages due to its electrical conductive properties. Typically, a 75-150 micron gap between areas of different potential in such packages is provided, which results in significant total dead space area having, for example, dark brown AlN in proximity to the light emitting elements. Soldermask is widely used because it is photo-imagable, or screen printable, but the material properties and application methods preclude its use in all conditions. White soldermask also discolors after solder reflow or with time and with photon exposure adding to the other existing problems of lumen loss and color shift. There is also a significant amount of area (e.g., known as "canyon walls") between light emitting elements that also absorb or poorly reflect the luminous light. These conventional solutions are, for the most part, inadequate for maximizing the total luminous flux of a solid state lighting component.

SUMMARY

Thus, in a first embodiment, a solid state lighting component is provided. The solid state lighting component comprises a substrate having a top surface, the top surface of the substrate comprising a first region comprising a die pad; a second region comprising a feature, the second region within or spaced apart from the first region by a portion of the top surface of the substrate; and a layer positioned within the first region at least partially surrounding the die pad and within the second region at least partially covering the feature, the layer comprising a material configured for scattering and/or reflecting emitted light.

In a second embodiment, a method of manufacturing a solid state lighting component. The method comprising: providing a solid state lighting component substrate with a top surface, the top surface having a first region comprising at least one die pad and a second region comprising at least one feature, the second region spaced apart from the first region; introducing a layer to the first region and the second region, the layer comprising a light reflecting and/or light scattering material, the layer at least partially surrounding the die pad and at least partially covering the feature.

In a third embodiment, a method of increasing the luminous flux of a solid state lighting component is provided. The method comprising: providing a solid state lighting component substrate with a top surface, the top surface having a first region comprising at least one die pad and a second region spaced apart from the first region on the top surface, the second region comprising at least one feature, wherein at least one of the top surface of the substrate, the at least one die pad, and the at least one feature absorb light emitted by an LED element; introducing a layer to the top surface of the substrate, the layer comprising a material configured to reflect and/or scatter light emitted by the LED element, the layer at least partially surrounding the die pad and at least partially covering the feature; and increasing the luminous flux of the solid state lighting component by reducing the amount of absorbed light.

A solid state lighting component is provided. The solid state lighting component comprising an array of LED elements; and a reflecting dam configured for scattering and/or reflecting emitted light from the LED element, the reflecting dam having a three dimensional structure at least partially surrounding one or more individual LED element of the array of LED elements, or the array of LED elements.

BRIEF DESCRIPTION OF THE DRAWINGS

FIG. 11A is a top plan digital image of an embodiment of an LED component according to the present disclosure;

FIGS. 11B-11C are top plan digital images of an embodiment of an LED component subassembly pre-mold, and a post mold LED completed component, respectively, according to the present disclosure;

DETAILED DESCRIPTION

Figure 1:
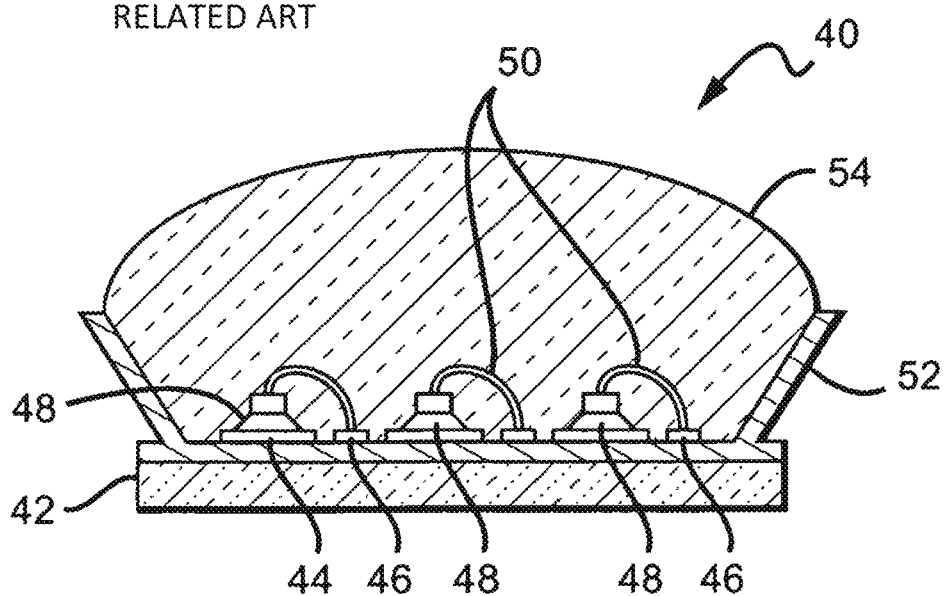
FIG. 1 shows a sectional view of a conventional LED component.

The present disclosure provides a solid state lighting component with a top surface having a first region comprising at least one die pad and a second region within or spaced apart from the first region, the second region comprising at least one feature, the solid state package comprising a layer with reflective and/or scattering properties and means to apply such layer. In one aspect, the layer is introduced to the top surface of the substrate within the first and second regions. In this aspect, portions of the top surface of the substrate are not covered by the layer. The layer can be introduced in a shape, for example, a shape corresponding to the die pad or any other shape. The layer can completely surround the die pad and or feature. In one aspect, the layer completely surrounds the die pad and completely covers the feature.

The layer comprises a matrix having a first index of refraction and a material having a second index of refraction greater than the first index of refraction, the material being dispersed, distributed, and/or suspended in the matrix. The layer, by proper selection of the matrix and the highly reflective material, can also provide electrical insulation to the plurality of LED elements, such that the spacing between the LED elements and/or other elements of the LED package can be minimized to the greatest extent possible. In one aspect, the substrate is or includes one or more ESD elements, the layer covering at least a portion thereof. A solid state lighting component having a layer and a manufacturing method thereof according to exemplary embodiments of the present disclosure will be described along with reference to the accompanying drawings. Reference is made to a solid state lighting component, however, any light emitting diode (LED) component or package is envisaged using the layer according to the present disclosure. LED components disclosed herein are inclusive of all surface mounted devices (SMD) type packages. Examples of solid state lighting components include ceramic packages, polyimide packages, lead frame package, and combinations thereof.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

As used herein, with reference to the material contained in the matrix, the material can be "reflect" and/or "scatter" light emitted from the light emitting element(s), which is inclusive of the material "reflecting" and/or "scattering" light emitted from the light emitting element(s). In one aspect, reflective and/or scattering material is chosen so as to minimize absorption of the emitted light, and/or in combination with the index of refraction of the matrix material.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

In a first embodiment, at least one LED element positioned on a top surface of a substrate capable of absorbing light emitted by the at least one LED element; and a layer at least partially surrounding the at least one LED element, and covering at least a portion of the top surface of the substrate, whereby at least a portion of the light emitted by the LED element is reflected and/or scattered by the layer, is provided. In one aspect, the substrate further comprises one or more features, for example, wire traces, wire bonds, Electrostatic Discharge Devices (ESD), and solder mask. Features can also include exposed surfaces of the substrate, and heteroepitaxial layers on the top surface of the substrate. For example, a portion of an AlN substrate or AlN or AlGaN epitaxial layer can be coated. The layer is arranged about the top surface of the substrate corresponding to the LEDs and the feature(s). In at least one aspect, the top surface of the substrate has a first region comprising the LEDs and/or die pads. A second region is arranged about the top surface of the substrate comprising the features, the features absorbing at least a portion of the light emitted by the LEDs. The second region is space apart from the first region and can be within the first region or outside the first region. The second region can be inclusive of the features.

The first and second regions can be of any defined geometrical or non-geometrical shape provided that they are spaced apart on the top surface of the substrate. In this manner the layer can be introduced to the top surface of the substrate to surround and/or cover specific areas of the lighting component while leaving portions of the top surface of the substrate without the layer. That is, the layer can be introduced to the substrate and/or the feature(s) on the substrate as any geometric shape, such as a dot, line, circle, square, or combinations thereof. In one aspect, the layer can be referred to as a "dam" or "reflective dam", for example, that at least partially surrounds the light emitting feature on the substrate, or that will be mounted on the substrate. Thus, the reflecting dam can surround one or more (or all) LED element of an array of LED elements and/or surround the array of LED elements. The dam can be arranged as any suitable three-dimensional structure (e.g., dots, lines, conforming or non-conforming shapes, continuous or discontinuous shapes, and the like) on the substrate and/or at least partially surrounding LED elements and/or surrounding or covering light absorbing features. Such configuration of layer on the top surface of the substrate has been found to increase the luminosity of the lighting component while reducing the amount of layer material employed and/or reduce heat that can be trapped in the layer material, which may be non-thermally conductive. Dispensing equipment, alone or in combination with an X-Y translational table, can provide for the precise positioning of the layer, e.g., around the LED/die pad and/or around and/or over the feature(s) about the top surface of the substrate.

In one aspect, the layer thickness of the layer in the vertical direction is equal in height to the light emitting surfaces and in other aspects is the layer thickness in the vertical direction is greater in height than the height of the LED element(s). In another aspect, the layer thickness in the vertical direction is equal to or less than the light emitting surface of the LED element. The layer comprises a matrix that is substantially transparent to and substantially non-absorbing of the light emitted by the LEDs and at least one material having a higher index of refraction than the matrix surrounding it so as to reflect and/or scatter the emitted light. In one aspect, the material has a significantly higher index of refraction. The layer can be employed in combination with a metal reflector element on the substrate or package walls to increase luminous efficacy and minimize loss of luminous flux of the LED package.

Typically, metal reflectors and electrical traces commonly found in LED packages are Ag coated to minimize absorption of visible light. In many cases traces are Au coated to eliminate Ag tarnishing problems, however, Au has high absorption in the visible spectrum. By applying the presently disclosed layer composed of a transparent, very low absorbing material and material capable of reflecting and/or scattering), light can be turned by a series of refractions to be reflected back with elimination or reduction of absorption loss. By eliminating or reducing the amount of light that is hitting higher loss Ag or Au surfaces or very high loss chip or uncoated substrate surfaces, lumens are saved. The layer according to the present disclosure can be applied to a LED package and improve the luminous flux of emitted warm white light or cool white light. In another aspect, the layer can be applied to a LED package and improve a color rendering index of emitted white light, or tune the colorpoint.

In one aspect, the lighting component comprises a plurality of LED elements in a densely packed arrangement. In this aspect, the layer is introduced about each of the plurality of LED elements. In this aspect, the layer can be introduced before and/or after die attachment and wire bonding.

In one aspect, the layer is comprised of a matrix comprising a predetermined loading of at least one high index of refraction material dispersed, distributed, and/or suspended therein. The matrix can be organic, inorganic, or a mixture thereof. Preferably, the matrix has an index of refraction that is lower than that of the high index of refraction material. For example, the matrix can have an index of refraction of less than about 1.6, preferably less than about 1.5. Preferably, the matrix is transparent in the visible spectra and/or at least a portion of the UV region (e.g., from about 200 nanometers to about 850 nanometers). Preferably, the matrix is at least 85% transparent in the visible spectra and/or at least a portion of the UV region corresponding to the wavelength(s) of the LED light emitted from the package, more preferably, the matrix is at least 90% transparent, most preferably, the matrix is greater than or equal to at least 95% transparent.

The combination of matrix and highly reflective material can provide a layer that is generally opaque and/or translucent in appearance, in part due to the loading and/or average particle size of the reflective material. In one aspect, the layer, after introduction to the LED package, is a translucent or opaque white or off-white in appearance. In other aspects, the addition of phosphors to or on the layer will provide a colored, translucent or opaque layer.

Suitable matrix materials (and their precursor materials) include organic polymers. Suitable transparent organic polymers include silicones, siloxanes, polyesters, polyurethanes, acrylics (e.g., polyacrylates, polymethacrylates, hereafter "poly(meth)acrylates"), epoxies, fluoropolymers, polyolefins, and co-polymer and/or combinations thereof. In one aspect polydimethylsiloxanes, polydimethylphenylsiloxanes, polyphenylsiloxanes, or blends are employed. Other polydialkyl-, polydialkylphenyl-, polydialkylalkylphenyl- and polyalklyphenyl-siloxane polymers can be substituted for the above matrix. Mixtures, copolymers, and blends of these siloxanes can be used. In one aspect, polydimethylsiloxane and/or polyphenylsiloxanes having sufficient pre-cure viscosities for introduction to the LED package that cure to a gel or hard durometer layer are preferred. In one aspect, the matrix material is transparent to the light emitted by the one or more LED elements of the package or lighting device.

The material can be any material with a high index of refraction, hereinafter also referred to as "high index of refraction material." In one aspect, the high index of refraction material has an index of refraction of greater than about 1.8, greater than about 2, preferably greater than about 2.2, and most preferably, greater than or equal to about 2.4. Suitable examples of high index of refraction material include inorganic compounds, such as titanium dioxide (n=2.4), zinc oxide, zinc sulfide, barium sulfate, boron nitride, talc, silica, alumina, zeolite, calcium carbonate, magnesium carbonate, barium sulfate, zinc oxide, titanium oxide, aluminum hydroxide, magnesium hydroxide, mica, montmorillonite clay, carbon particles, glass particles, carbon nanotubes, and mixtures thereof. The amount of high index of refraction material that can be used will at least depend, in part, on the choice of matrix chosen. To provide suitable reflectivity and/or scattering, the material preferably is optically transparent so as to minimize or eliminate absorption during operation of the lighting device. Also the material should not negatively affect the viscosity and/or curing and/or dispensability of the matrix. In one aspect, the loading of the high index of refraction material can be between about 3 weight percent to about 50 weight percent. Excess amounts of the high index of refraction material may result in delaminating of the layer and/or poor dispensing/dispersion of the material in the matrix. Insufficient amounts of the high index of refraction material may result in insignificant gains in total luminous flux for the package. In one exemplary aspect, about 6 to about 15 wt. % of the high index of refraction material is used in the matrix. In one aspect, the layer is configured so that when introduced to the LED package it will provided the layer at a predetermined thickness, preferably a thickness less than, greater than, or equal to the height of a light emitting surface of the substrate/submount mounted LED element. In one aspect, the layer is provided so as to be "optically thick", or as thick as possible such that as much light as possible would be scattered and/or reflected back to the greatest degree. "Optically thick" refers generally to the situation where beyond a certain thickness the layer thickness has negligible effect on the amount of reflected light or color. Very thin films of the same material may appear mostly transparent.

In certain aspects, the layer is comprised of one or more solid materials with an index of refraction of about 2.4 contained in a matrix with less than about 1.5 index of refraction. For example, in one aspect, a predetermined amount of titanium dioxide ($TiO_2$) comprising a two part, clear silicone matrix can be employed. Titanium dioxide can be present in one or more forms, e.g., rutile, anatase, and brookite. The average particle size of the titanium dioxide particles in the matrix can be between about 1 nanometer (nanoparticles) to about 500 microns. In certain aspects, the size of the titanium dioxide particles is between about 0.1 to about 10 microns, about 0.5 to about 5 microns, or a size distribution mixture can be used. The titanium dioxide can be added to either part (Part A and/or Part B) or both parts of a two-part matrix (e.g., silicone and/or epoxy resin).

In other aspect, the LED package comprises a plurality of LED elements post die attach and electrical connection, such as wire bond, the layer covering at least a portion of the substrate and at least partially surrounding the LED elements. In another aspect, the LED package comprises a plurality of LED elements post die attached and wire bonded, the layer covering at least a portion of the substrate and touching the LED elements. As discussed further below, the layer is substantially prevented from covering the light emitting surface(s) of the LED element(s). In one aspect, the layer can be configured to be essentially planar with the top surface of the LED element(s) (or higher) so as to improve or function as secondary optics, for example. This configuration provides LED packages with enhanced brightness by increasing the amount of reflected light compared to a LED package post die attached and wire bonded without the layer herein disclosed.

In one aspect as further discussed below, the layer can include one or more color shifting elements. The color shifting element can be included in the matrix, for example, dispersed or distributed with the highly reflective material. In other aspects, the color shifting element layer can be configured in a separate layer that can be adjacent to, on and/or under the layer, e.g., in a multi-layer configuration. In such aspects, different color shifting elements and/or equal or unequal amounts of one or more color shifting elements can be distributed among one or more of the multi-layers. Combinations of the above described configurations of matrix, highly reflective material, and color shifting element can be employed.

In other aspect, the LED package comprises a plurality of LED elements (arrays) post die attached and wire bonded, the layer covering the substrate and the sidewalls of the LED elements and channels between the array elements. As discussed further below, the layer can be configured to partially or substantially surround the edges of the individual LED elements of the array of LED elements and at least partially cover the substrate surface to which the LED element is attached and/or ESDs. This configuration provides LED packages with enhanced brightness by increasing the amount of reflected light relative to a LED package post die attached and wire bonded without the layer herein disclosed.

Second Layer Comprising Light Absorbing Material

In another embodiment, a second layer is provided, the second layer comprising a light absorbing material corresponding to at least a portion of the wavelengths of light emitted by one or more of the LEDs of the component. The second layer can be chosen for specific absorption characteristics suitable to achieve a more exact match to a color target, as well as to adjust and/or modulate the color, adjust and/or modulate the correlated color temperature (CCT), color rendering index (CRI) and other variables associated with human color perception of the LED component and/or lighting device. The second layer can be employed separately or in combination with the scattering/reflecting layer, for example, to provide a specific spectral pattern of an LED, an LED array, or a lighting device and/or to modulate, reduce, or eliminate a certain emitted wavelength peak. One or more discrete ranges of wavelengths of the emitted light from the LED can be absorbed. The wavelength range absorbed by the second layer can configured to absorb between about 1% to about 100% of the LEDs total emitted wavelength distribution. The second layer can be deposited and/or positioned on the substrate and/or features of the substrate in a manner similar to and/or identical to that of the scattering/reflective layer disclosed herein.

The second layer comprises a matrix polymer as described above for the scattering/reflective layer, for example, a matrix polymer that is essentially transparent to the wavelengths of light emitted by the LEDs. For example, a transparent matrix polymer can be selected from at least one of polysilicones, polyurethanes, and the like. Alternatively, the matrix polymer of the second layer can be absorbing of at least a portion of the emitted LED light wavelengths in combination with the absorbing material. For example, the matrix polymer can absorb at least a portion of UV light emitted by a LED, for example, a blue LED.

Light absorbing material of the second layer can be any material having absorbing characteristics, either by virtue of its chemical composition, particle size, or combinations thereof. For example, particles (including flakes, nanoparticles, beads, crumb, etc.) of one or more metals, metal alloys, metal-non metal compounds or complexes can be used as the light absorbing material. In one aspect, the light absorbing material can absorb in one wavelength region of the LEDs spectral emission and reflect in another, different, wavelength region. In one aspect, the light absorbing material is particles of aluminum or chromium metal, rare-earth oxides, for example, oxides of neodymium, didymium, dysprosium, erbium, holmium, praseodymium and thulium, which can be employed in an amount sufficient to eliminate or reduce at least a portion of the emitted LED light as desired, including all of the light at a defined angle of incidence, for example a high or low angle of incidence.

In one aspect, the light absorbing material has an average particle size smaller or larger than the wavelength (or of light of one or more of the LEDs to minimize scattering. For example particles of average particle size of about 1 nanometer to about 100 microns of the light absorbing material can be used, preferably, for handling and manufacturing, particles of average particle size of abut 1 micron to about 100 microns. In one aspect, light absorbing material that can pass through a 325 mesh, or more preferably, mesh screened material providing between 10-35 um particles can be used. In another aspect, a D50 diameter of 10 um can be used. In one aspect, aluminum, in the form of flake or particles, is employed as the light absorbing material to absorb wavelengths of about 444 nm to about 500 nm (blue light) while reflecting longer wavelengths. In another example, the light absorbing material comprises particles of solder mask of one or more colors, carbon black, graphite, etc., which can be employed in an amount sufficient to eliminate or reduce at least a portion of the emitted LED light as desired, including all of the light at a defined angle of incidence, for example a high or low angle of incidence. In yet another aspect, the light absorbing material can absorb emitted LED light and re-emit light of another wavelength, for example, by phosphorescence and/or fluorescence.

The second layer comprising the light absorbing material can be applied as a separate overcoat and/or undercoat layer to the scattering/reflecting layer. In other aspect, the second layer comprising the light absorbing material can be applied in a different region on or about the substrate from that of the scatter/reflecting layer to provide near field and/or far-field optical effects of the LED component and/or lighting device. For example, the second layer comprising light absorbing material can be deposited in one or both of the first or second regions, or deposited exclusive of the first and second regions. In another aspect, the light absorbing material can be dispersed, distributed, and/or mixed with the scattering/reflective material in the same matrix polymer to provide a specific spectral pattern and/or to eliminate a certain wavelength peak(s) of the LED component and/or lighting device, for example, deposited in an annulus-type pattern about the base of the exterior or interior of a lens of a lighting device. In one aspect, the second layer can be deposited in specific locations about the substrate and/or LED component. In this aspect, the second layer can balance/counter-act changes in CCT per viewing angle for the lighting device. In this aspect, output from specific areas of the lighting device can be reduced or eliminated, which would be more efficient than, for example, masking techniques, thus reducing or eliminating having to remove masking and disrupting otherwise "good" areas. In another aspect, the second layer can be employed to reduce or eliminate high angle light if the LED component or light device was found to provide unacceptable or off-target CCT or delta-CCT values.

In another aspect, the second layer with light absorbing material can be deposited at specific positions about the substrate. For example, the second layer can be spatially separated from the scattering/reflective layer to provide some absorbing effect on re-circulating light, so as to average out the emitted light to a more desirable, overall output.

In another example, the light absorbing material can be introduced into the layer comprising the scattering/reflective material and/or the substrate or portions thereof, for example, by chemical vapor deposition (CVD), impregnating into the surface or doping. In another aspect, the second layer comprising the light absorbing material, or the light absorbing material alone, can be deposited on or included in the optical media (lens and/or globe) of the lighting device.

LED Components with Layer

FIG. 1 shows a conventional LED component 40 comprising a substrate 42 for holding an array of LED chips, with the substrate having die pads 44 and conductive traces 46 on its top surface. LED chips 48 are included that comprise the LED array, with each of the LED chips 48 mounted to a respective one of the die pads 44. Wire bonds 50 pass between the conductive traces 46 and each of the LED chips 48 with an electrical signal applied to each of the LED chips 48 through its respective one of the die pads 44 and the wire bonds 50. Alternatively, LED chips 48 may comprise coplanar electrical contacts on one side of the LED (bottom side) with the majority of the light emitting surface being located on the LED side opposing the electrical contacts (upper side). Such flip-chip LEDs can be mounted onto the substrate 42 by mounting contacts corresponding to one electrode (anode or cathode, respectively) onto the die pad 44. The contacts of the other LED electrode (cathode or anode, respectively) can be mounted to the traces 46. An optional reflector element 52 can be included that is mounted to substrate around the LED chips 48, although in other embodiments the reflector can be arranged in different locations and can be shaped differently. One or more of the LED chips 48 in this embodiment can emit at a single color, or one or more of the LED chips 48 can be coated with a down-converting phosphor with each type of LEDs being connected at least into one connection circuit. For example, different color LED's can be arranged on the substrate, e.g., combinations of blue/green/red LED's, blue LED's with yellow phosphor adjacent red LED's, and the like. Alternatively, multiple types of LEDs can be simultaneously mounted on the substrate 42 with independent circuits, respectively. An optical element in the form of an encapsulant 54 such as a lens is included over the LED chips 48.

Figure 2:
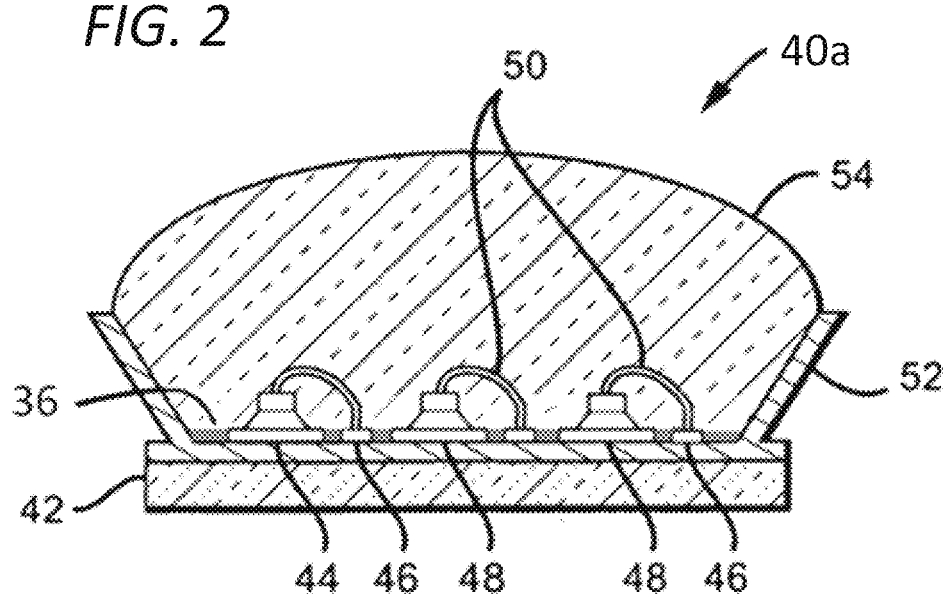
FIG. 2 is a sectional view of an embodiment of an LED component according to the present disclosure.

FIG. 2 shows a LED component 40a according to the present disclosure having beveled-edge LED chips 48 and layer 36 positioned between the LED chips 48, layer 36 extending laterally along the surface of substrate 42. In this exemplary aspect, layer 36 essentially surrounds the LED chips 48 and is flush with the light emitting beveled edge of the LED chips 48 providing essentially a planar surface over the substrate 42. In other aspects, layer is non-planar and/or contains planar and non-planar sections, such as an upwards/downwards taper at the edge of the LED's component and/or in proximity to the metal reflector element 52 (as shown in FIG. 2) and/or beveled edge of LED 48. In certain aspects, layer 36 essentially surrounds the LED chips. In certain aspects, layer 36 essentially surrounds the light emitting edges of the LED chips, up to but not including the light-emitting surface of the LED chips. In other aspects, layer 36 touches the at least one of the LED chips 48. It is understood that any depiction of a taper of the LED's edge and/or the layer is not limited to that depicted in FIG. 2.

The LED component 40a is shown with three LED chips 48, but it is understood that more LED chips can be included. At least some of the LED chips 48 are interconnected to minimize the number of contacts to the LED component and to allow operation with suitable drivers at the desired drive current, such as in the range of 50 to 150 mA. While component 40a is shown in a series arrangement, any electrical arrangement can be used, e.g., parallel, single. The "dead space" between LED chips is typically less than 0.50 mm and as shown in FIG. 4, is at least partially covered by layer 36. In certain aspects, the dead space between LED chips is completely covered by layer 36. In one embodiment, the spacing is 0.15 mm to 0.01 mm depending on the mounting process, allowing for the LED components to be densely arranged on the top surface of substrate 42. This allows for smaller sized devices that can have a form factor of existing lamps or even smaller, and can provide the ability to shape the output beam into a particular angular distribution. Other LED chip spacing dimensions can be employed, for example, greater than 0.15 mm or less than 0.01 mm. In other aspects, the LED chip 48 spacing is such that when layer 36 (or its precursor components) is introduced to the array of LED chips 48, layer 36 of a predetermined shape is formed about the individual LED chips 48 of the array. Layer 36 preferably is non-conducting, and therefore provides for the ability to reduce the LED array footprint by reducing the spacing between individual LED elements.

Figure 3:
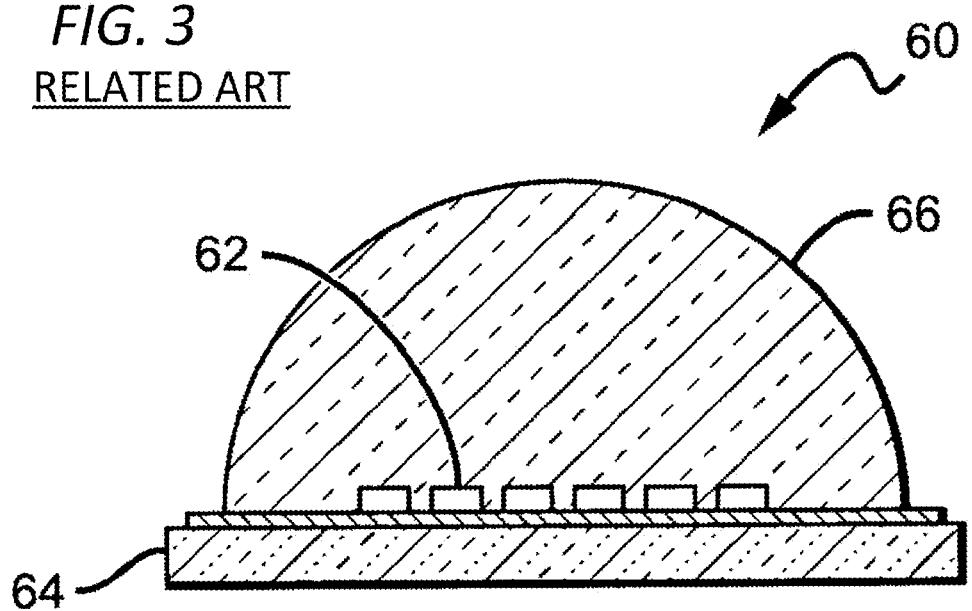
FIG. 3 shows a sectional view of a conventional LED component.

FIG. 3 shows a conventional monolithic LED package 60 comprising an array of LED chips 62 mounted on the surface of a substrate 64 with optical media 66. At least some of the LED chips 62 are interconnected in a circuit which can be a series, parallel, or single circuit, for example.

Figure 4A:
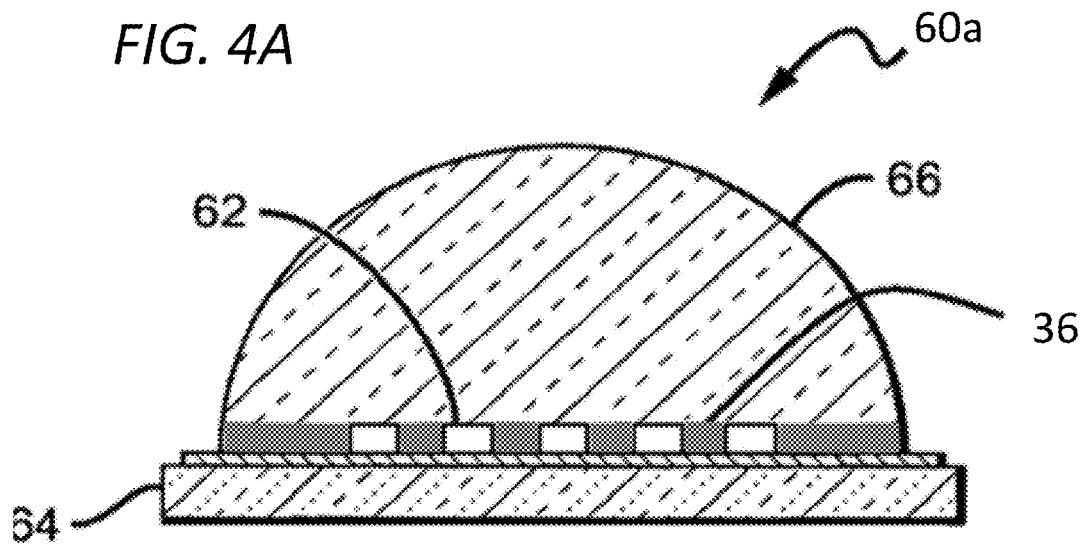
FIG. 4A is a sectional view of an embodiment of an LED component according to the present disclosure.

FIG. 4A shows a monolithic LED component 60a comprising an array of LED chips 62 mounted on the surface of a substrate 64 in accordance with the present disclosure. In a manner as discussed below, layer 36 is formed about LED chips 62 in a predetermined shape. Layer 36, which can be deposited as described below, can be configured to partially or completely surround LED chips 62 and can also be configured to cover electrical traces/pads, heat transfer materials, ESD's, etc. In the exemplary aspect of FIG. 4A, layer 36 essentially surrounds the LED chips 62. In other aspects, layer 36 has at least a portion of its height more than the vertical height of the light emitting top surface of LED chips 62. In other aspects, layer 36 is non-planar e.g., tapered and/or contains planar and non-planar sections. In certain aspects, layer 36 extends to optical media 66 to at least partially surround the interior of media 66 and/or contour the interior surface of media 66.

The LED chips 62 are preferably mounted on a substantially planar surface of the substrate 64 and are arranged under a single optical lens element, e.g., as shown by optical media 66. In other embodiments, the LED chips can be mounted on a non-planar substrate. In the embodiment shown, the component 60a can be configured to emit white light at a desired color point and color rendering index as a combination of light from the various LEDs, and simultaneously emits a predetermined luminous flux at high efficacy. Use of layer 36 in this configuration allows for light that otherwise would be absorbed and/or internally reflected to be reflected/directed to exit the package, thus providing a net gain in total luminous flux for the LED package. Color shifting elements can be employed in this configuration.

For example, the LED chips 62 can be coated with one or more phosphors with the phosphors absorbing at least some of the LED light and emitting a different wavelength of light such that the LED emits a combination of light from the LED and the phosphor. In one aspect, one or more phosphors can be compounded with layer 36. For example, the one or more phosphors can be included in the matrix together with the highly reflective material. In other aspects, each of the LED chips 62 can be coated with one or more color shifting elements and employed in combination with layer 36. Thus, in one aspect, the LED chips 62 can be coated with one or more phosphors and layer 36 can be applied on/over the phosphor coating and/or comprise one or more phosphors.

In one exemplary embodiment according to the present disclosure, LED chips 62 are configured to provide a resultant white light, e.g., cool white or warm white. For example, LEDs chips 62 can have an LED that emits light in the blue wavelength spectrum and the phosphor absorbs some of the blue light and re-emits yellow, with the LED chips 62 emitting a white light combination of blue and yellow light. In one embodiment, the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include, for example: $Tb_{3-x}RE_xO_{12}$:Ce(TAG); RE=Y, Gd, La, Lu; or $Sr_{2-x-y}Ba_xCa_y$-$SiO_4$:Eu.

The LED chips 62 can be configured for emitting red light, for example, they can comprise LED structures and materials that permit emission of red light directly from the active region. Alternatively, in other embodiments, the LED chips 62 can comprise LEDs covered by a phosphor that absorbs the LED light and emits a red light. Some phosphors appropriate for these structures can comprise, for example: Red $Lu_2O_3$:$Eu^{3+}$ $(Sr_{2-x}La_x)(Ce_{1-x}Eu_x)O_4Sr_2Ce_{1-x}Eu_xO_4Sr_{2-y}Eu_xCeO_4$ $SrTiO_3$:$Pr^{3+}$,$Ga^{3+}$ $CaAlSiN_3$:$Eu^{2+}$ $Sr_2Si_5N_8$:$Eu^{2+}$. Other phosphors can be used to create color emission by converting substantially all light to a particular color. For example, the following phosphors can be used to generate green light: $SrGa_2S_4$:Eu; $Sr_{2-y}Ba_ySiO_4$:Eu; or $SrSi_2O_2N_2$:Eu, or the following phosphors can be used to generate yellow/green light: $(Sr,Ca,Ba)(Al,Ga)_2S_4$:$Eu^{2+}$ $Ba_2(Mg,Zn)Si_2O_7$:$Eu^{2+}$ $Gd_{0.46}Sr_{0.31}Al_{1.23}O_xF_{1.38}$:$Eu^{2+}{}_{0.06}(Ba_{1-x-y}Sr_xCa_y)SiO_4$: $EuBa_2SiO_4$:$Eu^{2+}$. As another example, LEDs of group III-nitride-based blue LED chips and/or group-III nitride-based ultraviolet LED chips with a combination or mixture of red, green and orange phosphor can be used. One or more LEDs can be arranged with one or more phosphors so as to provide one or more of blue-shifted yellow (BSY) light, blue-shifted green (BSG) light, blue-shifted red (BSR) light, green-shifted red (GSR) light, and cyan-shifted red (CSR) light. Thus, for example, a blue LED with a yellow emitting phosphor radiationally coupled thereto and absorbing some of the blue light and emitting yellow light provides for a device having BSY light. Likewise, a blue LED with a green or red emitting phosphor radiationally coupled thereto and absorbing some of the blue light and emitting green or red light provides for devices having BSG or BSR light, respectively. A green LED with a red emitting phosphor radiationally coupled thereto and absorbing some of the green light and emitting red light provides for a device having GSR light. Likewise, a cyan LED with a red emitting phosphor radiationally coupled thereto and absorbing some of the cyan light and emitting red light provides for a device having CSR light. Other structures, arrangements, and combinations of single and/or multi-color LED-phosphor chips can be employed to provide a desired lighting effect, as is generally known in the art.

The substrate 64 can be formed of many different materials with a preferred material being electrically insulating, such as a dielectric element, with the substrate being between the LED array and the component backside. The substrate can comprise a ceramic such as alumina, aluminum nitride, silicon carbide, or a polymeric material such as polyimide and polyester etc. In the preferred embodiment, the dielectric material has a high thermal conductivity such as with aluminum nitride and silicon carbide.

In other aspects of the above embodiments, the substrate 64 can also comprise additional highly reflective material, such as reflective ceramic or metal layers like silver, to enhance light extraction from the component and/or complement layer 36. The surface of the substrate 64 can be pre-treated with adhesion promoters and/or coupling agents known in the art to improve the adhesion of layer 36 to the surface of the substrate, sides/edges of the LED chips providing that such adhesion methods do not substantially degrade the performance of the LED elements or package.

In other embodiments the substrate 64 can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used such as standard FR-4 PCB, metal core PCB, or any other type of printed circuit board.

It is understood that LED components according to the present disclosure can be fabricated using a method that incorporates substrate panel or wafer comprising a plurality of submounts. Each of the submounts can be formed with its own array of LEDs and optical elements 66 such that multiple LED chips 62 can be formed across the submount panel. Multiple LED chips 62 can then be singulated from the submount panel. Each submount may also comprise a more complex combination of elements such as a plurality of "submount" assemblies which are mounted on a planar surface of submount. As more fully described below, the submount assemblies can have different functionalities such as providing electrostatic discharge (ESD) protection elements (not shown) for the various LED chips. In such embodiments, layer 36 can be employed as described above so that layer 36 essentially surrounds the LED chips and is flush with the top surface of the LED chips and/or covers the ESD element.

The size of the submount in LED package can vary depending on certain factors such as the size and number of LEDs. In one embodiment, the sides of the submount can be approximately 12 mm by 13 mm. It is further understood that the submount can have other shapes including circular, oval, rectangular, hexagonal or other multiple sided shapes.

Figure 4B:
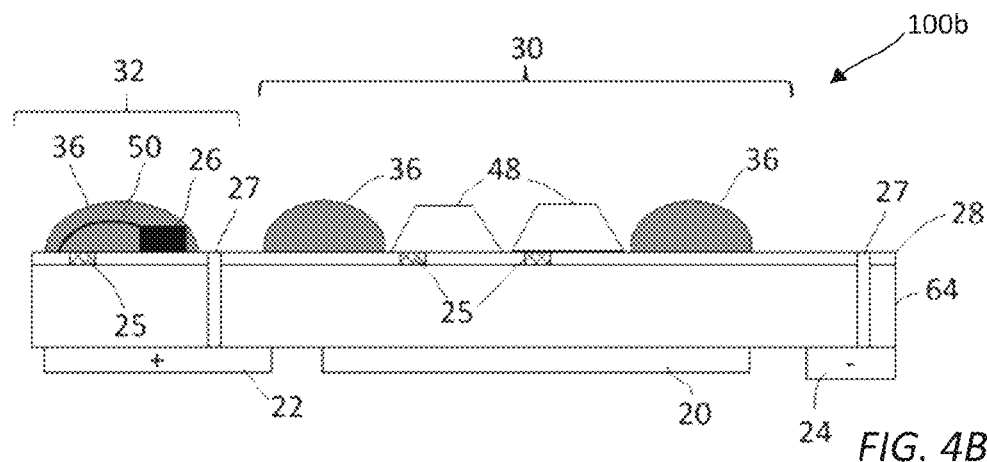
FIGS. 4B, 4C, and 4D are sectional views of additional embodiments, respectively, of an LED component according to the present disclosure.

FIG. 4B depicts another embodiment of an LED component 100b having substrate 64 with active layer 28, substrate 64 having heat sink 20 and P/N junctions 22 and 24, respectively, connected to the opposing surface of substrate 64 by vias 27. First region of top surface of substrate 64 comprises arrayed LEDs 48 within first region 30 with layer 36 at least partially surrounding the array. Second region 32 comprising feature, e.g., ESD 26, solder mask 25, and wire bond 50, having layer 36 completely covering features 25, 26, and 50. Second region 32 is spaced apart from first region 30 on top surface of substrate 64. In this configuration, layer 36 provides a three dimensional near field reflective structure on the top surface of substrate 64 to provide improved luminance and reduced absorption of light by one or more absorbing features ESD 26, solder mask 25, and wire bond 50.

Figure 4C:
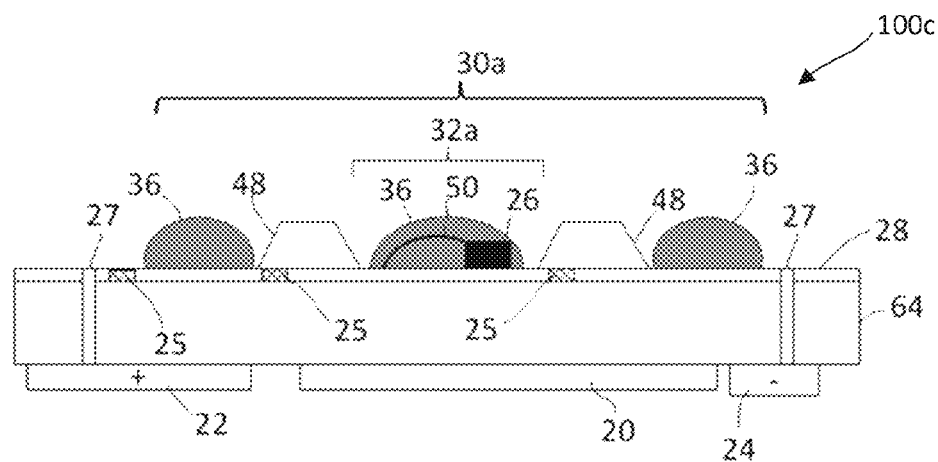

In alternate configurations, FIG. 4C depicts another embodiment of an LED component 100c having substrate 64 with active layer 28, substrate 64 having heat sink 20 and P/N junctions 22 and 24, respectively, connected to the opposing surface of substrate 64 by vias 27. Top surface of substrate 64 comprises arrayed LEDs 48 within first region 30a with layer 36 at least partially surrounding the array. Second region 32a comprising ESD feature and wire bond feature 50, having layer 36 covering features 26 and 50 which is spaced apart from and within first region 30a on top surface of substrate 64. In this configuration, layer 36 provides a three dimensional near field reflective structure on the top surface of substrate 64 to provide improved luminance and reduced absorption of LED emitted light by one or more absorbing features ESD 26, solder mask 25, and wire bond 50. Second region is within first region, e.g., ESD 26 is positioned within the layer surrounding LED or die pad and ESD 26 is at least partially covered.

Figure 4D:
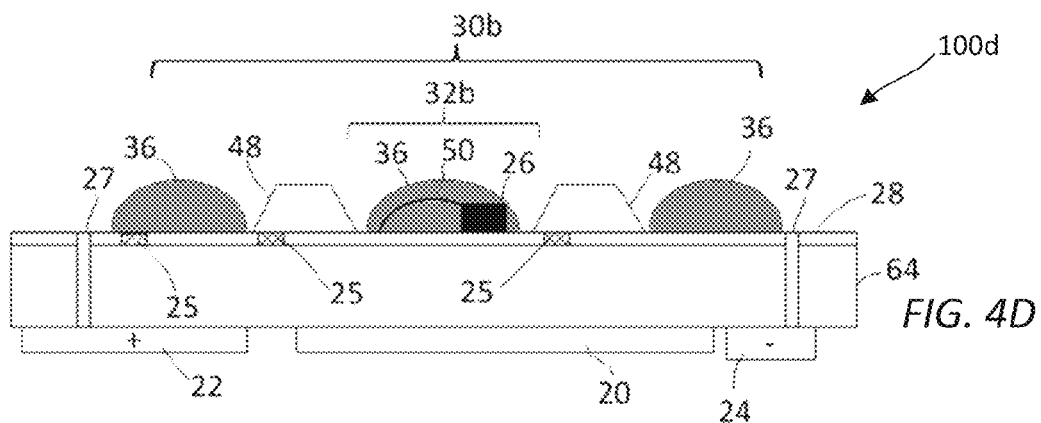

FIG. 4D depicts another embodiment of an LED component 100d having substrate 64 with active layer 28, substrate 64 having heat sink 20 and P/N junctions 22 and 24, respectively, connected to the opposing surface of substrate 64 by vias 27. First region 30b of top surface of substrate 64 comprises arrayed LEDs 48 within first region 30b with layer 36 at least partially surrounding the array and at least partially covering solder mask feature 25 or electrode gap in the case of no solder mask. Second region 32 comprises ESD feature 26, and wire bond feature 50, having layer 36 completely covering features 26 and 50. Second region 32b is spaced apart from first region 30b on top surface of substrate 64. In this configuration, layer 36 provides a three dimensional near field reflective structure on the top surface of substrate 64 to provide improved luminance and reduction of LED emitted light by one or more absorbing features ESD 26, solder mask 25, and wire bond 50. Other arrangements of layer 36, first region 30b, and second region 32b, in relation to features 25, 26, and 50 as well as LED 48 are envisaged so as to provide improved luminance and reduced absorption of LED emitted light by one or more absorbing features.

Figure 5A:
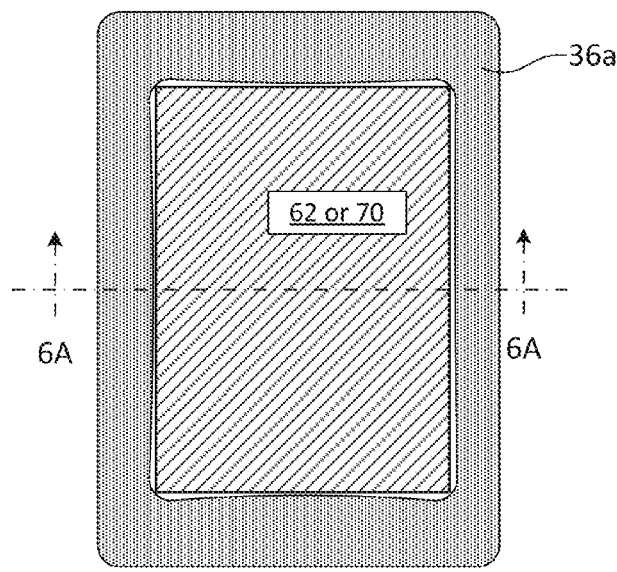
FIGS. 5A-5B are top plan views of embodiments of the present disclosure.
Figure 5B:
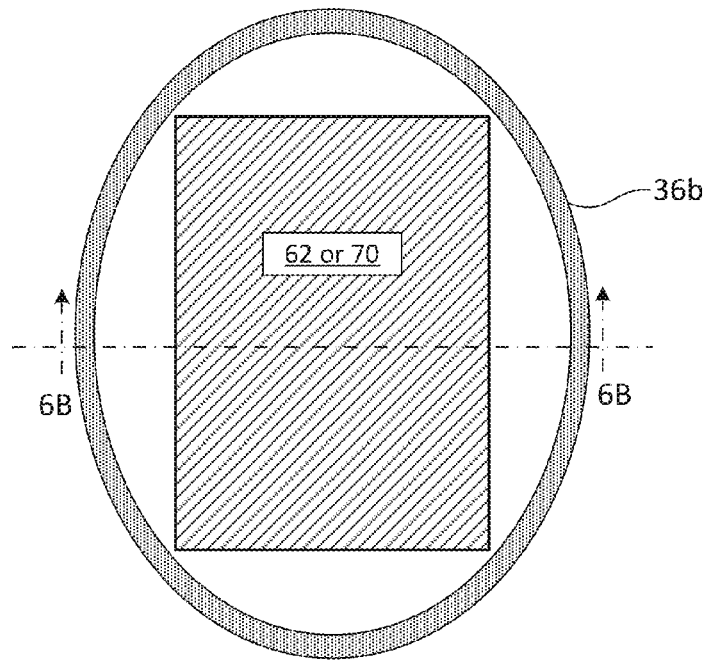

FIGS. 5A and 5B depict top plan views of die attach pad 70 (or LED) having embodiments of the present disclosure, having shaped layers, for example, an annular-like layer 36b, and polygonal-like layer 36a, respectively, about the respective perimeters of pad 70 (or LED). One aspect is shown, where layers 36a, 36b completely surrounds the perimeter of die attachment pad 70 (pre-mold) or of LED 62 (post-mold). Some spacing between pad 70 and layer 36a, 36b is tolerable.

Figure 6A:
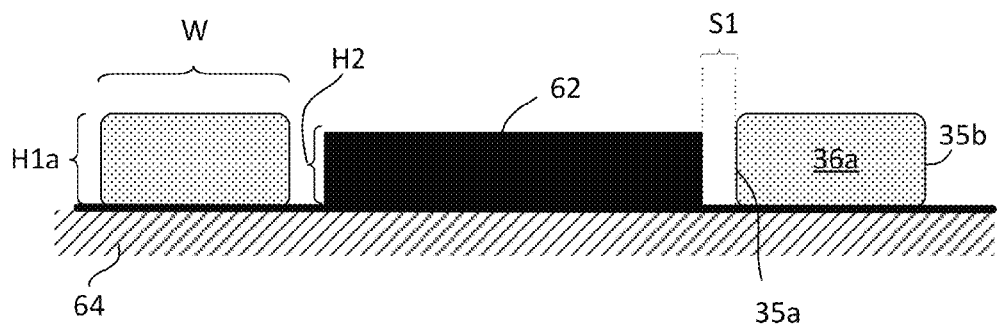
FIG. 6A is a sectional view of FIG. 5A along line 6A-6A.

Referring now to FIG. 6A, cross sectional views of substrate/LED/layer of FIG. 5A along line 6A-6A, is shown with an exemplary shape about LED 62 (which can also be pad 70). FIG. 6A depicts layer 36a of generally or substantially polygonal shape with height H1a less than, equal to, or greater than LED 62 height H2, which can include the height of pad 70. Layer 36a has an inner surface 35a in proximity to LED 62 and outer surface 35b in further proximity to LED 62 than that of inner surface 35a. Thus, the predetermined shape of layer 36a has a first surface (e.g., 35a) projecting from substrate 64 and in proximity to LED element 62, and a second surface (e.g., 35b) projecting from substrate 64 and in further proximity to LED element 62 than the first surface. Polygonal-like shape is inclusive of square and rectangle shapes with straight, curved or unequal lengths and/or angles defining the lengths.

Figure 6B:
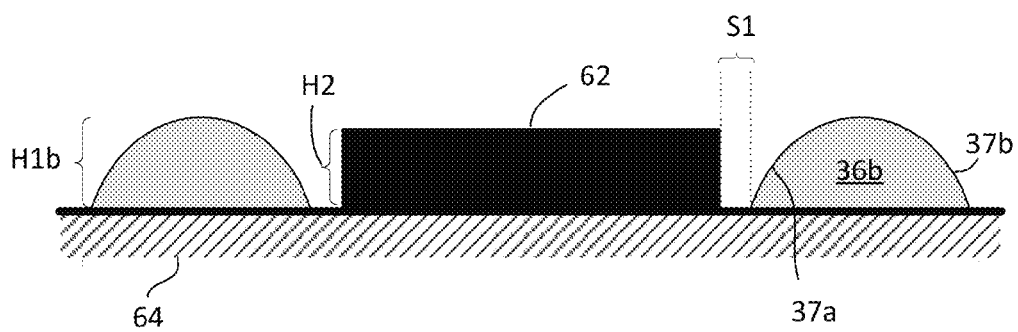
FIG. 6B is a sectional view of FIG. 5B along line 6B-6B.

Referring now to FIG. 6B, cross sectional views of substrate/LED/layer of FIG. 5B along line 6B-6B, is shown with an exemplary shape about LED 62 (which can also be pad 70). FIG. 6B depicts layer 36b of a generally half-circumference, annular-like shape, with height H1b equal to or greater than LED 62 height H2, which can include the height of pad 70. Layer 36b has an inner surface 37a in proximity to LED 62 and outer surface 37b in further proximity to LED 62 than that of inner surface 37a. Annular-like is inclusive of ring or oval shapes and such shapes including linear sections.

Figure 6C:
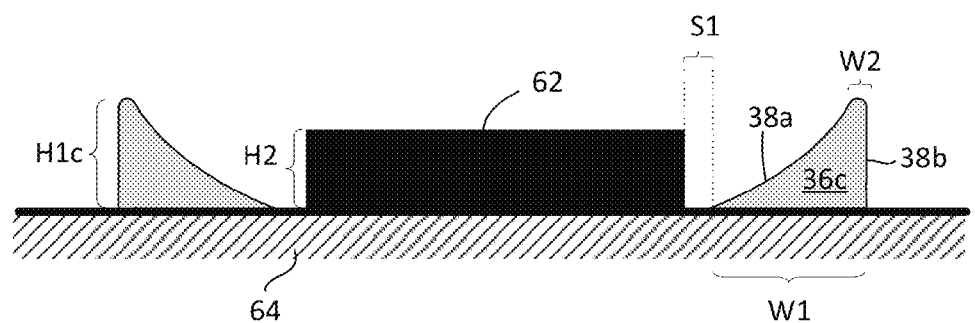
FIG. 6C is a sectional view of an alternated embodiment of the present disclosure.

FIG. 6C depicts layer 36c (e.g., reflective dam), with inner surface 38a in proximity to LED 62, having a width W1 adjacent to substrate 64. FIG. 6C differs from that of FIG. 6B in that inner surface 38a has a taper, e.g., with inner surface 38a tapering away from LED 62 to a width W2 at height H1c equal to or greater than LED 62 height H2, which can include the height of pad 70 (not shown). Layer 36c has outer surface 38b in further proximity to LED 62 than that of tapered inner surface 38a. Layer 36c with tapered inner surface 38a can be generally annular-shaped and/or generally polygonal-shaped about LED 62.

With reference to FIGS. 6A-6C, space S1 between the corresponding inner surface of layers 36a, 36b, and 36c can be reduced such that at least a portion of the corresponding inner surface touches LED 62, or enlarged such that no portion of the corresponding inner surface touches LED 62, or portions of layer touches LED 62 and portions do not touch LED 62. In another aspect, space S1 between the corresponding inner surface of layers 36a, 36b, and 36c can be reduced such that the corresponding inner surface touches LED 62 and extends a height above that of LED height H2. Layer 36 (as represented by 36a, 36b, and 36c in FIGS. 6A-6C) width W (along substrate 64) can be predetermined based on the density of die attachment pads 70 (not shown) and/or LED 62 used. In one aspect, W is less than the distance between die attachment pads 70 and/or LED 62, e.g., some portion of substrate 64 is not covered by layer 36. In other aspects, layer 36a, 36b, and 36c can physically contact or at least partially touch the LED along a vertical edge thereof. In another aspect, layer 36a, 36b, and 36c can be physically separated from the LED along a vertical edge thereof.

Figure 7:
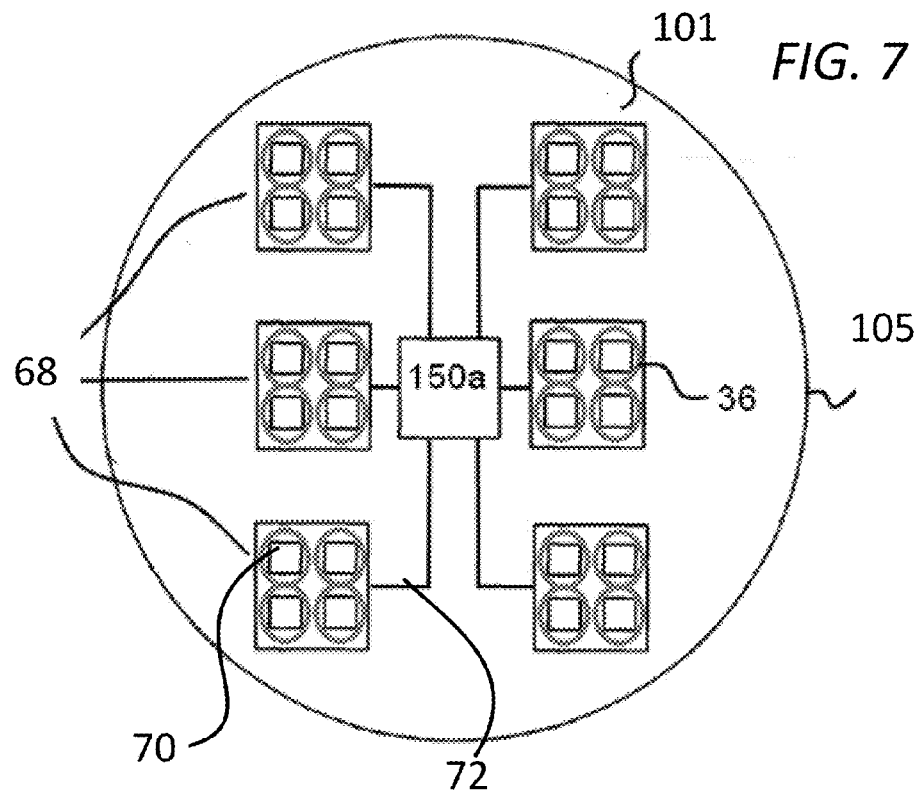
FIG. 7 shows a top plan view of one embodiment according to the present disclosure.

Referring now to FIG. 7, a top plan view of a LED package is shown having planar surface with LED arrays 68, die attach pads 70 and interconnecting conductive traces 72 providing conductive paths for electrical connection to LED arrays 68 and for providing power via control circuit 150a. Each of LED chips (not shown) of LED array 68 can be mounted to a respective one of attach pads 70 using known methods and material mounting using conventional solder materials that may or may not contain a flux material. Alternatively, flip chip LEDs can be mounted as described above on the attach pads and conductive traces. Attach pads 70 and interconnecting traces 72 can comprise many different materials, such as metals or other conductive materials, and in one embodiment they can comprise copper deposited using known techniques such as plating. Other substrate materials present about the LED that can absorb light includes soldermask. Soldermask comes in many colors from very dark (e.g., green) to shades of white. As previously mentioned, conventional plating materials such as gold or silver can be used, regardless of their tendency to absorb or discolor, respectively, using layer 36 of the present disclosure. As shown in FIG. 7, layer 36 is arranged in a shape (e.g., annular-like) about each die pad 70 (which can also be mounted with on or more LEDs). In one aspect, each individual LED (or just one LED) of a given die pad 70 can be presented with layer 36 of a shape and height, or, alternatively, groups of LEDs on a given die pad 70 can be presented with layer 36 of a shape and height commensurate with the shape and height of the LED(s). Combinations of such arrangements of LED/die pad/layer 36 can be used.

Figure 8:
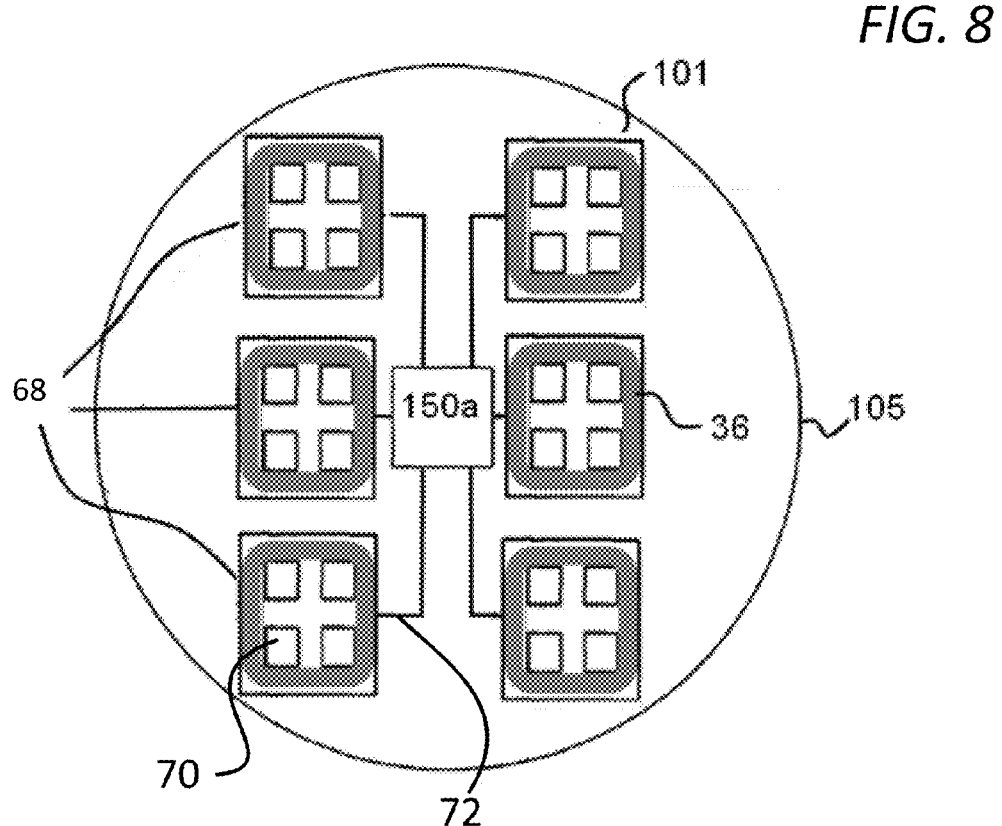
FIG. 8 is a top plan view of an embodiment of an LED package according to the present disclosure.

Referring now to FIG. 8, a top plan view of an alternate embodiment of the present disclosure having substrate 64 shown having planar surface with layer 36 at least partially surrounding LED array 68 in a polygonal-like shape about. In one aspect, layer 36 completely surrounds die attach pads 70, as shown. In another aspect, layer 36 at least partially surrounds die attach pads 70 and/or LED in a polygonal-like shape. Layer 36 can be provided in an annular-like or a polygonal shape, e.g., square, rectangle, triangle, can including one or more concave or convex walls/edges/surfaces or sides about die attach pads 70 and/or individual LED elements of LED array 68. In another aspect, layer can surround LED array 68 in an annular-like or polygonal-like shape as described above. In another aspect, layer can surround LED array 68 in an annular-like or polygonal-like shape as described above in combination with layer 36 at least partially surrounding individual pads 70 and/or LED elements of array 68.

Still referring to FIG. 8, individual LED chips can be pre-mounted and wire bonded to a respective one of the attach pads using known methods and material mounting using conventional solder materials that may or may not contain a flux material. As discussed below, LED chips preferably can similarly be pre-mounted and electrically connected to conductive traces using known surface mount or wire bonding methods depending on the geometry of LED chips prior to introduction and/or forming of layer 36, as described below. In one aspect, the array comprises flip chip LEDs mounted as described above on attach pads 70 and conductive traces with layer 36 provided in any of the configurations described above.

Figure 9A:
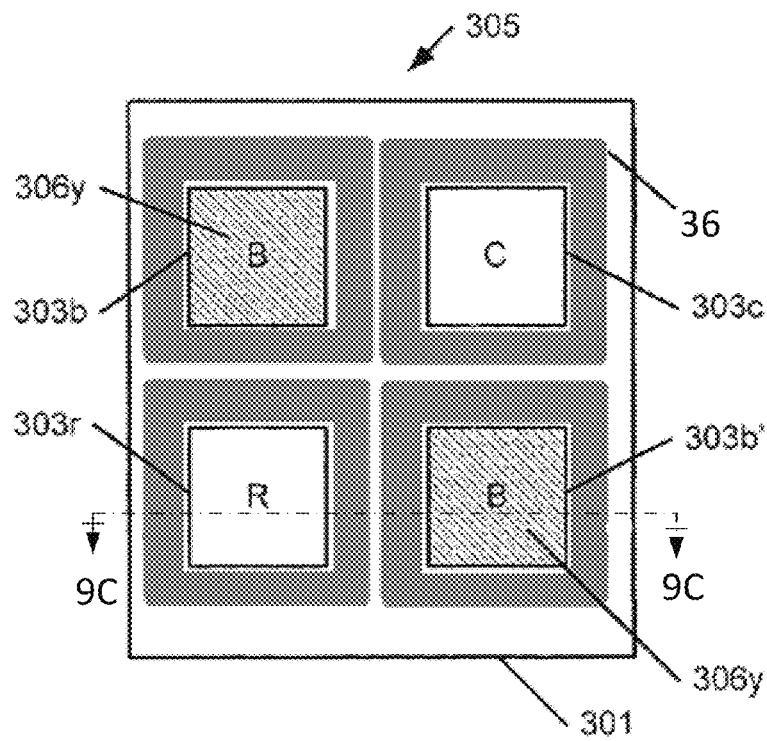
FIG. 9A is a top plan view of an embodiment according to the present disclosure.

FIG. 9A depicts LED component 305 having different color LEDs arranged on a common submount 301 including two diametrically opposed blue LED chips 303b and 303b', a cyan LED chip 303c, and a red LED chip 303r mounted on a common submount 301. As shown in FIG. 3C, a conversion material containing a yellow-emitting phosphor 306y at least partially covers all of the LED chips 303b, 303b', 303e, and 303r on the submount 301. For example, in some embodiments, the yellow-emitting phosphor 306y may be configured to convert at least a portion of the blue light emitted from the blue LED chips 303b and 303b' into yellow light. In some embodiments, the conversion material may further include a red-emitting phosphor in addition to the yellow-emitting phosphor 306y.

Figure 9B:
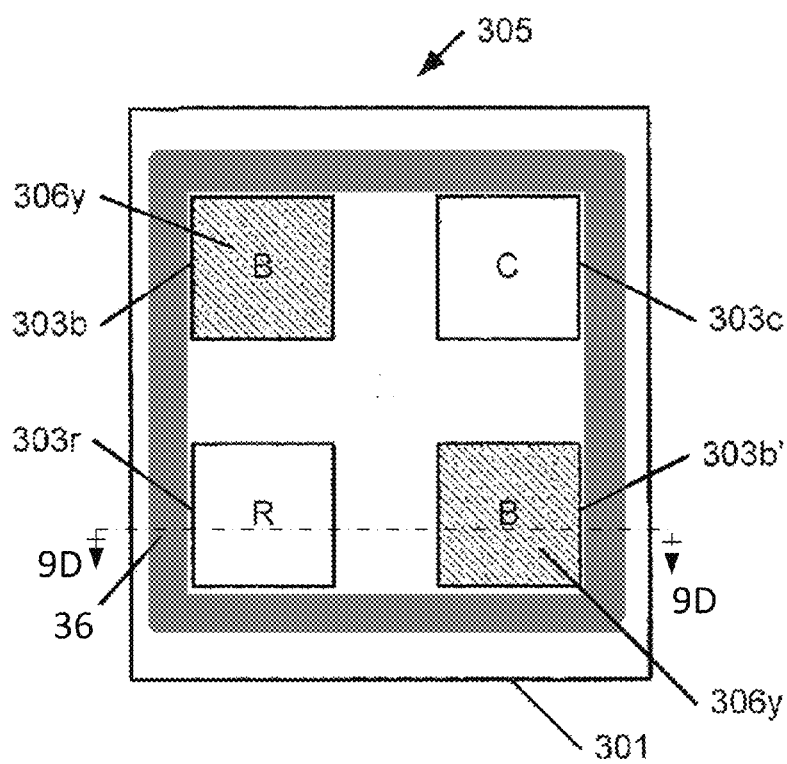
FIG. 9B is a top plan view of an alternate embodiment according to the present disclosure.

FIG. 9B depicts the same LED component 305 of FIG. 9A with alternate arrangement of layer 36 about an array of multi-color LEDs. In one aspect, a combination of the arrangement of FIGS. 9A and 9B can be used, e.g., on any given die pad 70, or a combination of die pads each having one or the other arrangement as depicted in FIGS. 9A and 9B can be used.

Alternatively, with respect to FIGS. 9A and 9B, different arrangements of colored LEDs can be used, arranged (two, three, six, etc., for example, blue and red LEDs without the cyan) and presented with layer 36 about individual and/or arrays of LEDs. For example, in some embodiments, the LED chip 303c may be a blue LED chip at least partially covered by a green or yellowish-green phosphor, such as LuAG (Lanthanide+YAG). In other embodiments, additional remote-phosphor coatings can be used in conjunction with the arrangements disclosed above. In yet another embodiment, only blue LEDs are used in combination with layer 36.

Figure 9C:
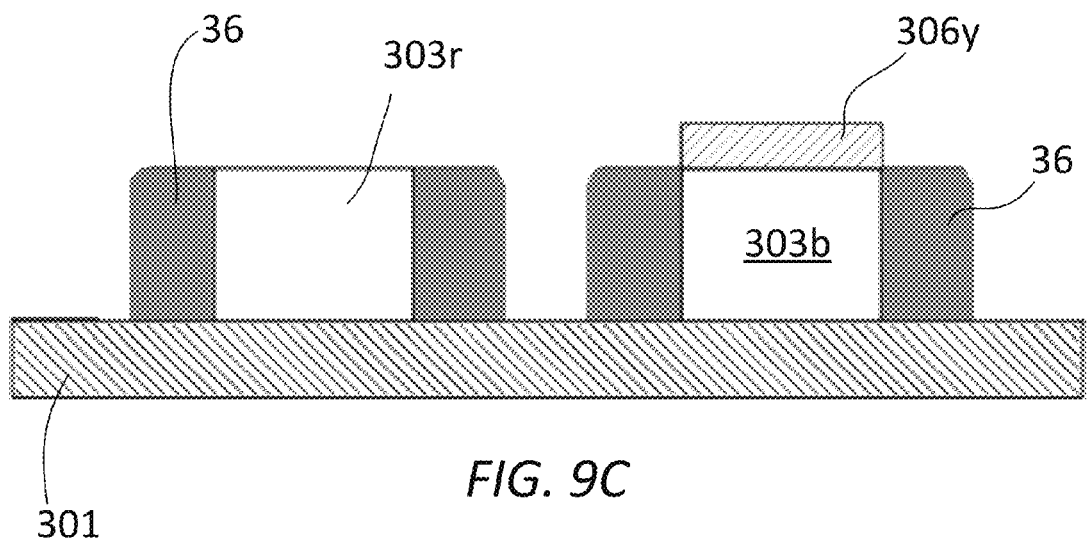
FIG. 9C is a sectional view of FIG. 9A along line 9A-9A.

FIG. 9C depicts a section view of FIG. 9A along line 9A-9A, showing one aspect of a height relationship between layer 36, LED (303r, 303b) and phosphor coating 306y, where layer 36 is presented about individual LEDs.

Figure 9D:
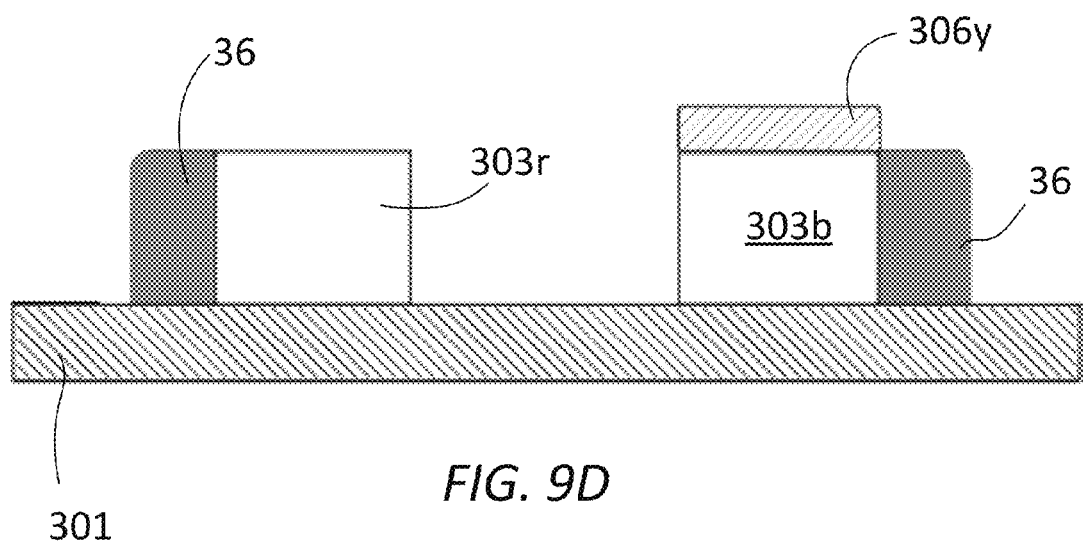
FIG. 9D is a sectional view of 9B along line 9B-9B.

FIG. 9D depicts a section view of FIG. 9B along line 9D-9D, showing one aspect of a height relationship between layer 36, LED (303r, 303b) and phosphor coating 306y, where layer 36 is presented about an array of LEDs.

Figure 10A:
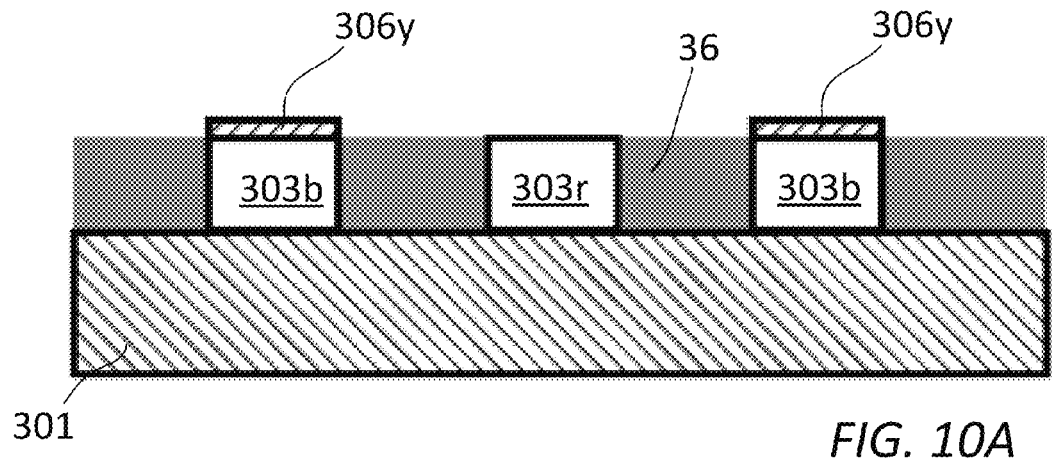
FIGS. 10A, 10B, and 10C are sectional views of various embodiments according to the present disclosure.
Figure 10B:
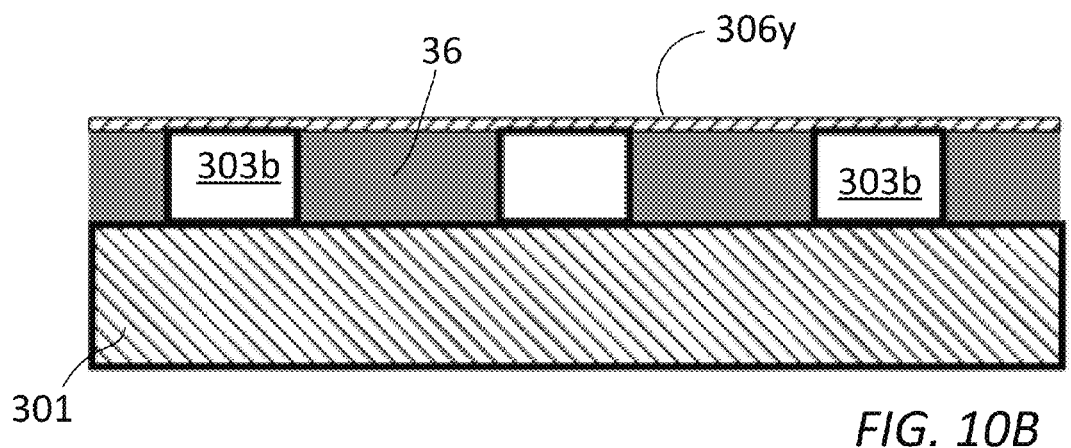
Figure 10C:
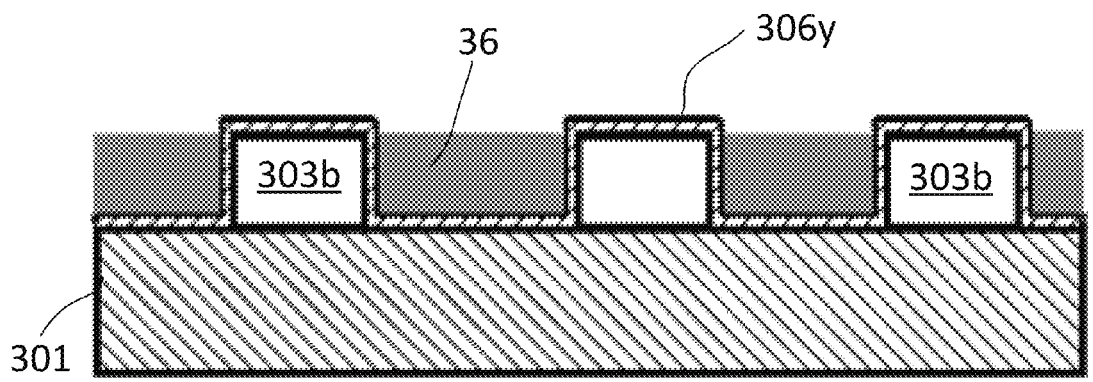

FIGS. 10A, 10B, and 10C depict additional embodiments of arrangements for layer 36 using phosphor coated LEDs. These figures serve as an exemplary embodiment that encompasses any combination of LED/phosphor combination of utility in providing LED lighting devices. Thus, FIG. 10A depicts layer 36 positioned between LEDs (303b, 303r) with and without phosphor coating 306y on the light emitting surface thereof. Masking techniques can be used to introduce the phosphor to specific LEDs after layer 36 is provided. Alternatively, after layer 36 is provided, a blanket coating of phosphor 306y can be mask-removed from the light emitting surfaces of specific LEDs. FIG. 10B depicts a blanket coating of phosphor 306y over layer 36 positioned between LEDs (303b, 303r). FIG. 10C depicts a conformably phosphor coated arrangement with layer 36 positioned between LEDs (303b, 303r) and covering portions of the phosphor 306y and leaving other portions of the phosphor coating uncovered, e.g., about the light emitting surfaces of the LEDs.

Figure 10D:
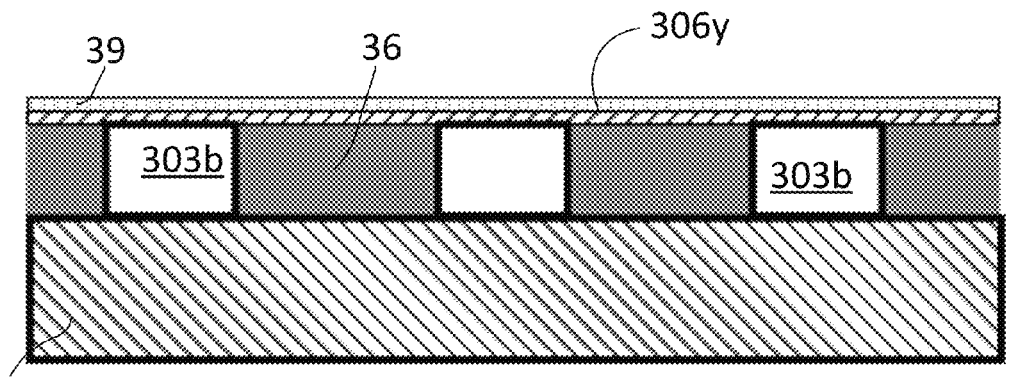
FIGS. 10D and 10E are sectional views of an alternate embodiment of FIGS. 10A and 10B respectively, including a second layer, according to the present disclosure.
Figure 10E:
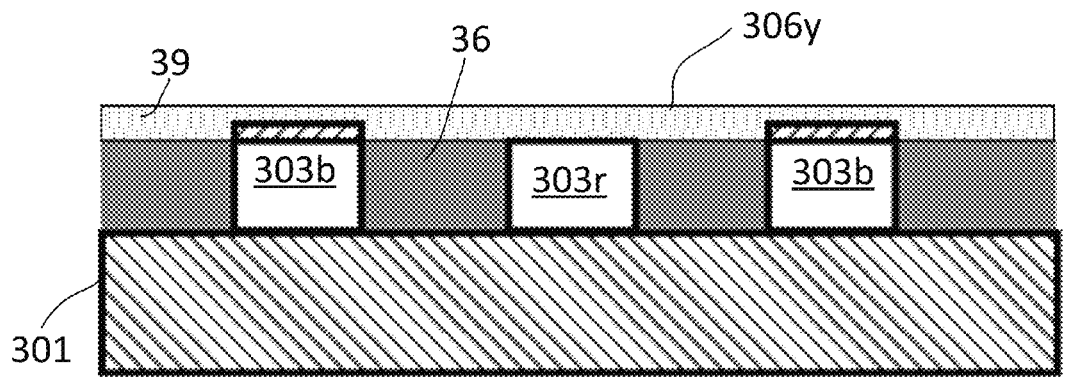

FIGS. 10D and 10E depict additional embodiments similar to the embodiments of FIGS. 10A and 10B, respectively, having second layer 39 deposited thereon. Second layer 39 is shown deposited over the phosphor layer 306y and LEDs 303b or 303r. Second layer can of course be deposited under layer 36, for example, on the substrate, or remotely on an optical component (not shown).

Figure 10F:
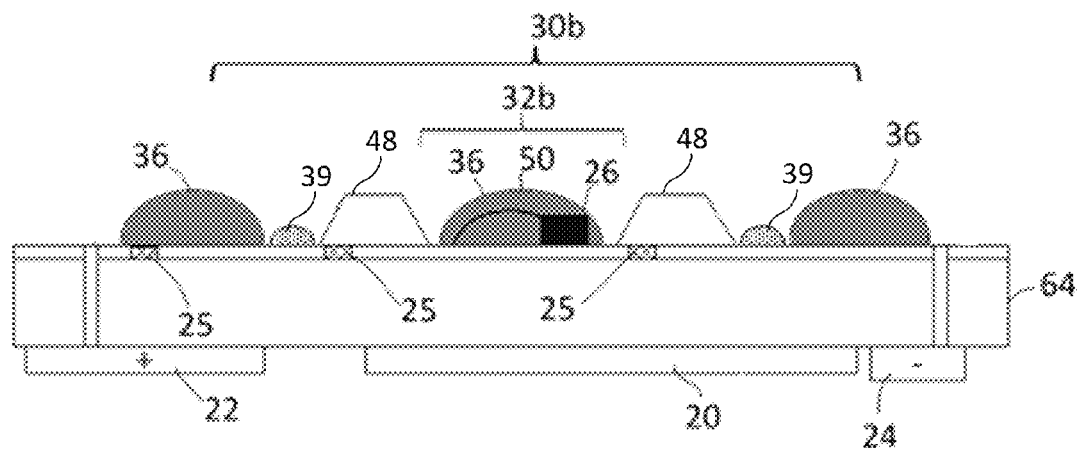
FIG. 10F is a sectional view of an alternate embodiment of FIG. 4D including a second layer, according to the present disclosure.

FIG. 10F depicts an additional embodiment similar to the embodiment of FIG. 4D, with second layer 39 deposited in a specific region of the substrate top surface 28. Second layer 39 can be within first region 30b, within second region 32b, within both first and second regions 30b, 32b, or can be positioned or deposited exclusive of either first or second regions 30b, 332b.

FIG. 11A is a top plan digital image of an embodiment where LED 62 is surrounded by polygonal-like shaped layer 36a (pre-mold). Layer 36a represents by example, a three-dimensional reflecting dam surrounding the die, the dam shown as a continuous shape that presents an irregular topography on one or more sides, but in other aspects can be discontinuous in shape. FIG. 11B depicts embodiments, namely pre-mold component 91 shown with digital side-by-side images of annular-like layer 36a and polygonal-like layer 36a about separate LED 62 and substrate trace 72, respectively. FIG. 11C depicts post mold component 93 shown with digital side-by-side images of annular-like layer 36a and a polygonal-like layer 36a at least partially surrounding LED 62 and optical media 66. FIG. 11A shows white scattering media covering some of the dark line of the gap between plated metal traces. FIG. 11B (left side image) shows some of dark gap 72 and some of the ESD 26, visible in the straight down plan view, but nonetheless, layer 36b still provided a positive effect for the highest intensity angle as compared to the right side image in FIG. 11B with trace 72 and ESD uncovered by layer 36a. Component 91 was even brighter when layer 26a covered the dark gap 72 and ESD 26 (data not shown).

Figure 12A:
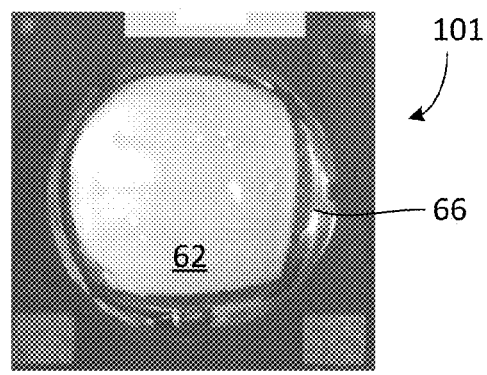
FIG. 12A is a top plan digital image of a conventional LED package.
Figure 12B:
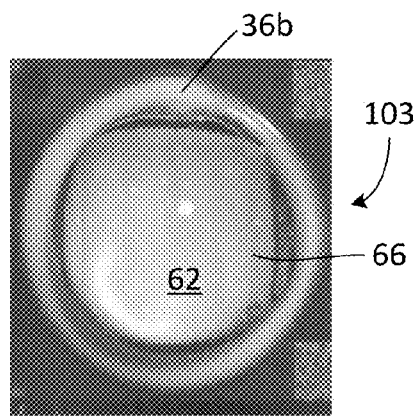
FIGS. 12B-12C are top plan digital image of embodiments of a post mold LED package, according to the present disclosure.
Figure 12C:
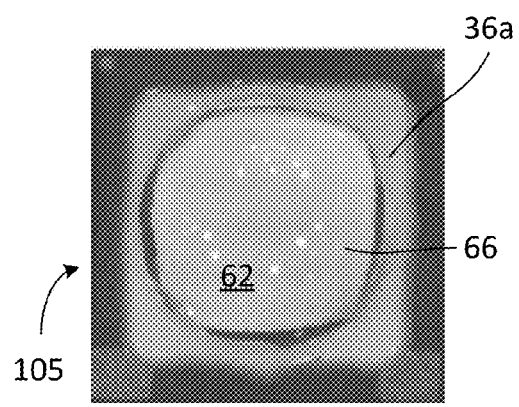

FIG. 12A is a top plan view of a conventional LED package 101 showing optical media 66 about LED 62. FIGS. 12B-12C are top plan, digital images of alternate embodiments of a post mold LED package, according to the present disclosure. Thus, FIG. 12B shows package 103, with annular-like layer 36b surrounding optical media 66, while FIG. 12C shows package 105, with polygonal-like layer 36a surrounding optical media 66.

Figure 13:
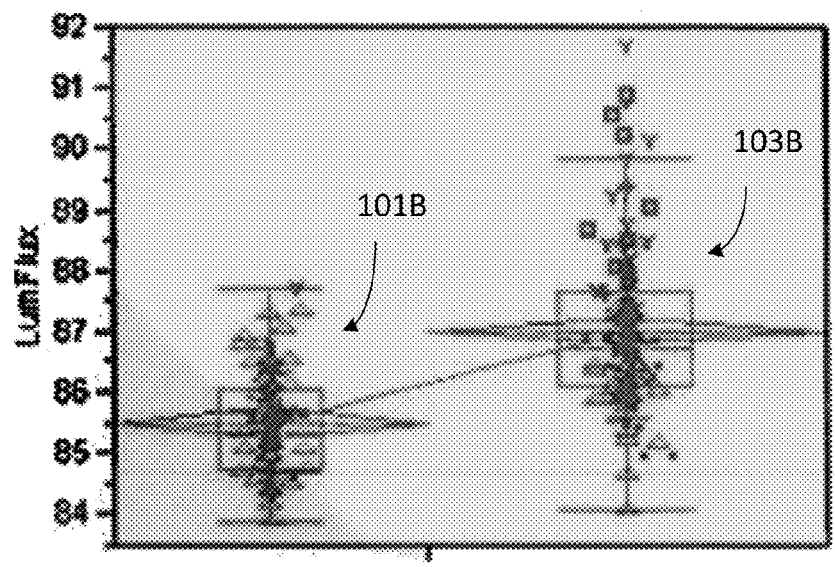
FIG. 13 is luminous flux data of the conventional LED package of FIG. 11 and that of FIG. 12A.

FIG. 13 is luminous flux data of the conventional LED package of FIG. 11 and that of FIG. 12A demonstrating the improvement in luminous flux of the present embodiment 103, having luminous flux distribution 103B, compared to that of conventional package 101, having luminous flux distribution 101B. Thus, partially surrounding the individual post mold LED completed component with a reflective material as disclosed herein provides for an improvement of the LED package's luminous flux compared to that of a post mold LED component without reflective material at least partially surrounding the individual LED package.

Forming the Layer

In another embodiment of the present disclosure, a method of forming the layer for a LED package capable of improving luminous efficacy and minimizing loss of luminous flux is provided. Thus, a manufacturing method is provided comprising providing a solid state lighting component comprising at least one LED element or die attachment pad mounted on a top surface of a substrate and introducing a layer to the at least one LED element in a shaped pattern about each element/pad. In one aspect, the method comprises providing a solid state lighting component comprising a plurality of LED elements and/or die attachment pads mounted on a top surface of a substrate, the plurality of LED elements and introducing a low index of refraction matrix comprising a high index of refraction material dispersed, distributed, or suspended therein; and forming a layer individually around the LED element/pad in a shaped pattern.

Thus, in one exemplary embodiment, there is provided a solid state lighting component comprising: a substrate having attached thereto at least one LED element; and a layer formed around the at least one LED element and covering at least a portion of the substrate surface. The layer can be of a vertical height relative to the LED chips that is a height flush with the top surface of the LED chips (e.g., surrounding and/or touching the vertical sides of the LED chips) or greater than the light emitting surface of the LED chips.

In one aspect, the layer can be produced by providing a matrix material and dispersing, distributing, and/or suspending one or more highly reflective material using known compounding and/or dispersive/distributive mixing techniques. In certain aspects, the matrix is a two-part, curable formulation. In one aspect, one or more of foaming agents can be introduced to either or both of the two-part portions, provided that it does not substantially affect the curing of the matrix. Thus, for example, a predetermined amount of titanium dioxide can be added to one part of a two-part curable silicone resin to provide a precursor formulation suitable for use as described below. In another aspect, the matrix can be introduced to the substrate and then highly reflective material can be incorporated in the matrix, optionally with a foaming agent. Incorporation includes providing an equal distribution or concentration gradient of the highly reflective material in the thickness of the matrix.

An aspect of the manufacturing method includes providing at least one LED element mounted on a substrate, the substrate capable of absorbing the light emitted by the LED element. A matrix (or its pre-cured precursor(s)) comprising a highly reflective material as described above, of a viscosity suitable for forming a shaped layer about the individual elements of the LED array, is provided. The combined viscosity of the matrix (e.g., pre-cured, two-part formulation, curable one-part formulation, or molten/solvent-castable formulation) is preferably chosen so as to provide for workability of the layer in shaping the layer about the LED element and/or arrayed LED elements. The introduction of the layer can be on planar or non-planar substrates. Once the pre-cured, combined two-part matrix material has been introduced to the LED elements and has leveled to a predetermined height relative to that of the light emitting surface of the LED elements, the matrix is allowed to (optionally foam), cure, harden, or set. Curing can be performed with or without the use of heat and/or light, for example, by drying at room temperature. While the above example is exemplified by using to a two-part silicone matrix, other suitable matrixes can be substituted and configured with the predetermined loading of one or more of optional foaming agent(s) and/or highly reflective material(s) and viscosity adjusted to provide for the introduction thereof about the LED elements as described above. For example, a matrix comprising one or more of the optional foaming agent and/or the highly reflective material can be melted at a temperature below the solder flow point and introduced to the at least one LED chip and substrate, the melted matrix having a viscosity capable of providing a shape or being shaped. Alternatively, the matrix and one or more of the optional foaming agent and/or the highly reflective material can be solvent-diluted to a sufficient viscosity and then the solvent driven off (and optionally foamed) using heat. In one aspect, the at least one LED is an array of LED elements. The size of the array can be small (e.g., 2×2) or large (>2×>2). As discussed above, in certain aspects, the array comprises different color light-emitting LEDs with or without phosphor coatings or can comprise a single color light-emitting LED.

Masking techniques and/or molding techniques can be used to introduce and/or remove portions of the matrix so as to shape the layer, for example, into an annular-like or polygonal-like shape about the elements on the substrate. For example, The LED encapsulant precursor may be sprayed, cast, coated, deposited, or dipped in proximity to, directly to, or on the lighting device, in particular the light emitters, LEDs, or LED assembly, alone or in combination with masking/molding techniques to form the desired shaped layer. The dispensing of the encapsulant precursor may be performed using any known dispensing technique.

In one aspect, an angled dispensing nozzle can be used. Such a dispensing nozzle can be rotated or otherwise translated about the elements on the substrate while dispensing the matrix with highly reflective material. Alternatively or in combination, the substrate and/or dispensing nozzle can be translated or rastered to provide a desired shape about the elements on the substrate. Such manipulation of either the nozzle and/or substrate can be computer controlled or partially computer controlled (semi-manual). The introduction step can be configured to provide a layer of any desired height, width, length, perimeter, or diameter.

Figure 14:
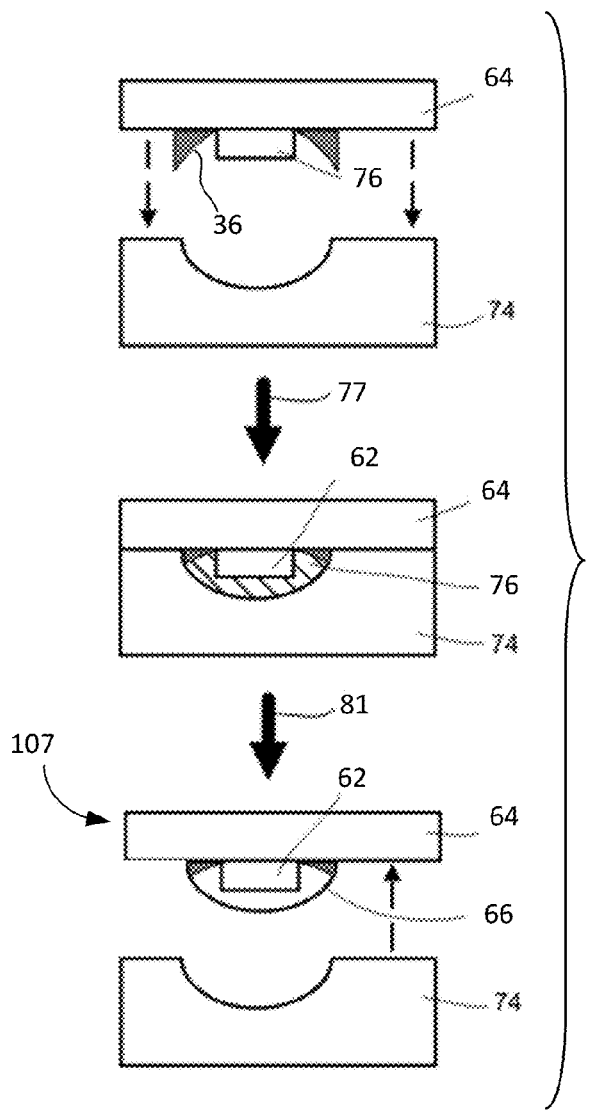
FIG. 14 is an exploded sectional view of an embodiment for a manufacturing process according to the present disclosure.

FIG. 14 presents an exploded view of an exemplary process schematic for providing an embodiment, whereas a side view of LED 62 with layer 36 having a shape is shown mounted on a support substrate 64. Support substrate 64 can be any type of substrate, a printed circuit board, a heat sink, or another structure. Mold 74 as shown has indentations 75 of a size corresponding to the desired shape of intended optical media 66, e.g., lens, positioned over, about, or around one or more of LED 62. Mold 74 can be constructed of any material capable of releasing the encapsulant precursor after curing. In one aspect, mold is a metal or alternatively, a metal having a coating, such as Teflon, or other releasing film, coating, placed or formed over or in the metal mold, and/or the metal can be pre-treated with a material to aid in releasing the finished lens and/or that prevents sticking thereof.

Referring still to FIG. 14, mold indentions 75 are filled with a curable encapsulant precursor 76. In one aspect encapsulant precursor 76 is a liquid capable of flowing into mold indentations 75 or being urged into the indentations by pressure or vacuum. In one exemplary process, a vacuum seal is provided between support structure 64 and mold 74. Substrate 64 with LED 62 and mold 74 are then pressed against each other under a compression force as illustrated by step 77. Encapsulant precursor 76 is inserted into the volume between substrate 64 and mold 74. Mold 74 can, if desired, be heated to a predetermined temperature for a predetermined time so as to cure and/or harden encapsulant precursor 76 into an encapsulant 78, such as an optical media or lens. Phosphor and other material can be added to encapsulant precursor 76. In one aspect, layer 36 contours the interior of optical media 66, as shown. Alternatively, layer 36 can be configured to at least partially surround optical media.

After the predetermined time at the predetermined temperature, the support structure is then separated from mold as illustrated in step 81 to provide finished package 107. In one aspect, a cooling of the components is carried out before separation. If a releasing film is used, it is removed and LED 62 with encapsulant 78, shown as an optical lens, can be removed from mold 74. Layer 36 is shown with a tapered surface in proximity to the LED and/or optical media 66 and in optical communication with the light emitted by the LED so as to reflect such light out of the package and/or prevent or reduce luminous losses from light trapped in the optical media 66.

Figure 15:
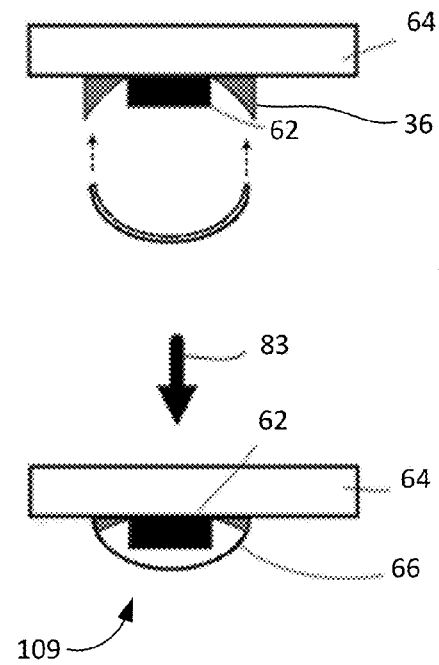
FIG. 15 is an exploded sectional view of an alternate embodiment for a manufacturing process according to the present disclosure.

FIG. 15 represents an exploded view of an alternative manufacturing embodiment wherein substrate 64 comprises pre-formed layer 36 having a shape about LED 62, layer 36 having a tapered surface in proximity to LED 62. Optical media 66, e.g., a pre-formed dome or lens is positioned about LED 62 as shown in step 83 to provide finished package 109 having tapered layer 36 in proximity to optical media 66 so as to prevent or reduce luminous losses from light trapped in the optical media 66. In one aspect, layer 36 contours the interior of optical media 66, as shown. Alternatively, optical media 66 can be configured to at least partially surround layer 36.

Figure 16:
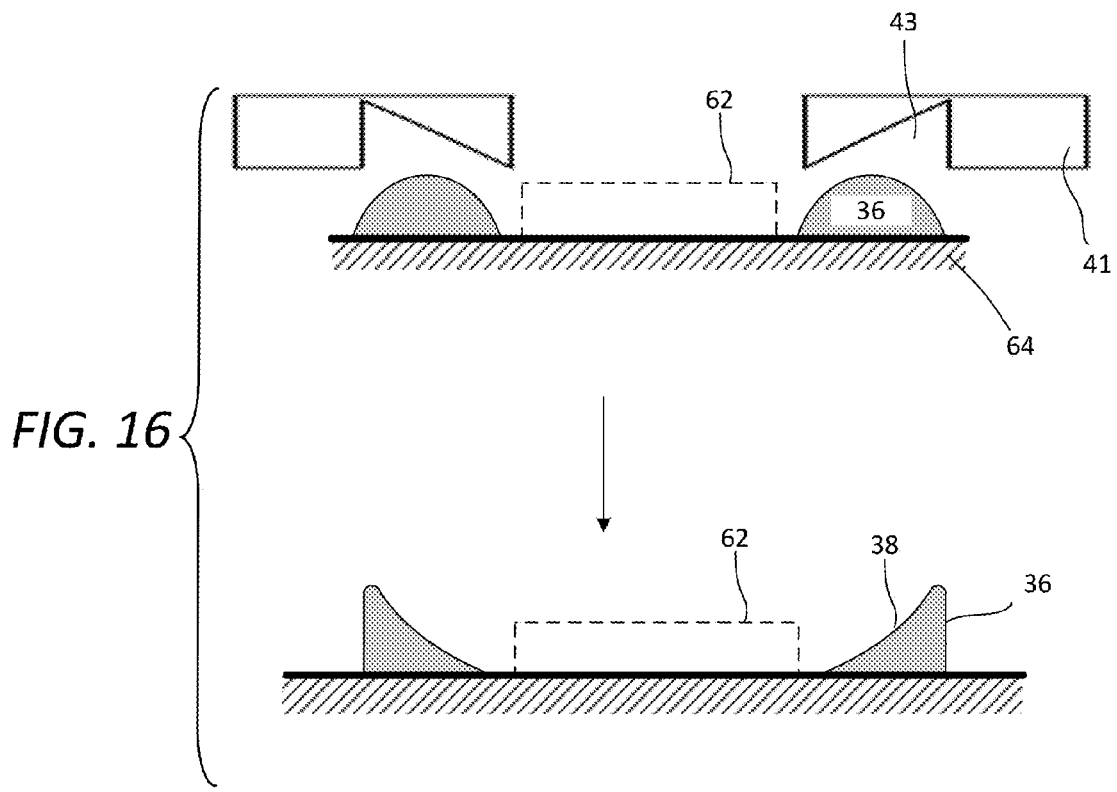
FIG. 16 is an exploded sectional view of an alternate embodiment for a manufacturing process according to the present disclosure.

FIG. 16 represents an alternative manufacturing embodiment wherein substrate 64 comprises pre-formed layer 36 about LED 62 or attachment pad 70, layer 36. Mold 41 having shaped feature 43 is introduced to layer 36 so as to form tapered surface 38 or other shaped surface in proximity to LED 62 or attachment pad 70. Optical media 66, e.g., a pre-formed dome or lens can subsequently be positioned about LED 62 as in FIG. 14 or 15, described above.

Figure 17:
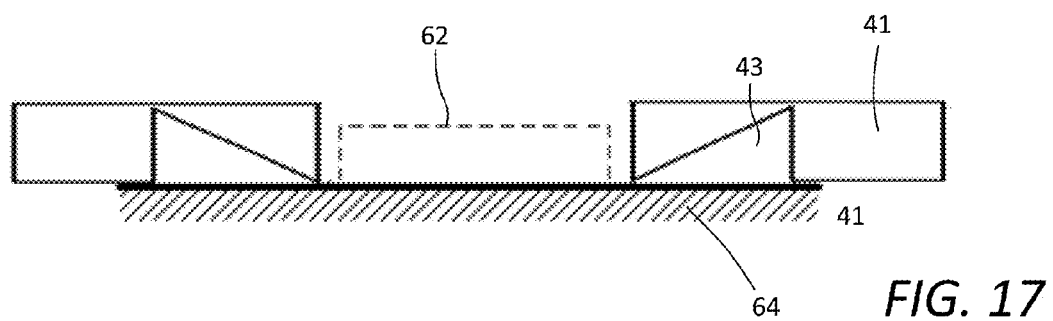
FIG. 17 is an exploded sectional view of an embodiment for a manufacturing process according to the present disclosure.

FIG. 17 represents an alternative manufacturing embodiment wherein mold 41, having shaped feature 43, is introduced to substrate 64 and layer 36 is introduced about LED 62 or attachment pad 70, within spacing between mold 41, shaped feature 43, and substrate 64 so as to provide layer 36 with tapered surface 38 in proximity to LED 62 or attachment pad 70. Optical media 66, e.g., a pre-formed dome or lens can subsequently be positioned about LED 62 as in FIG. 14 or 15, described above.

Figure 18:
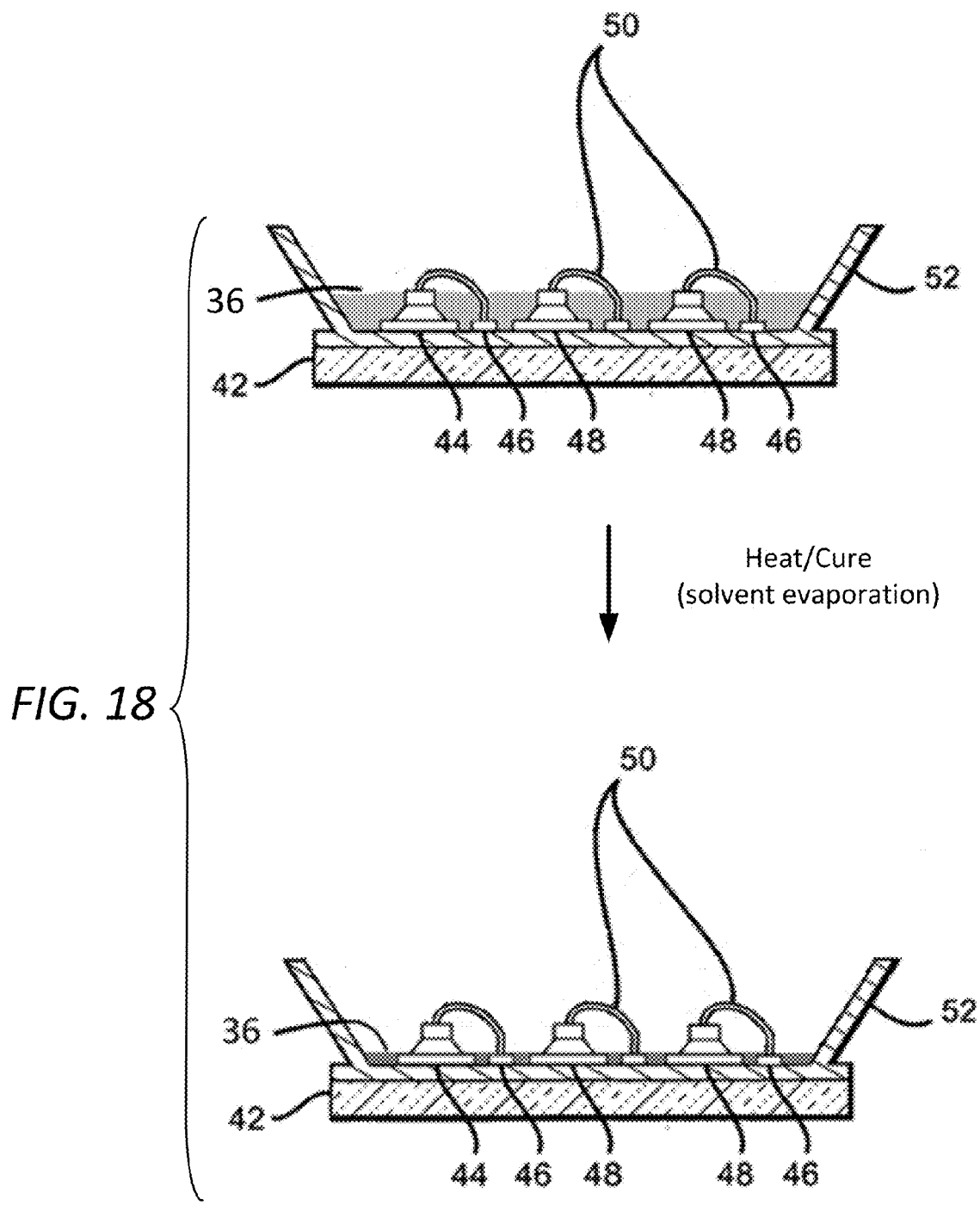
FIG. 18 is an exploded sectional view of an embodiment for a manufacturing process according to the present disclosure.

FIG. 18 represents an alternative manufacturing embodiment wherein assembly 40a of FIG. 2 (without lens) is contacted with layer 36, layer 36 containing an amount of solvent and optionally, processing aids, to provide a coating over die pads 44 and substrate. Coating can be dispensed using conventional means. Layer 36 can be components that cure or set, such as a two-part silicone, epoxy, or polyurethane, either by heat, moisture, and/or light. Evaporation of solvent (optionally with heating) provides layer 36 of a desired height. Such a process can be employed on phosphor coated LEDs, arrays of phosphor coated and/or non-phosphor coated LEDs. Masking techniques can be used to arrange layer 36 in a shape in the first and second regions about the top surface of the substrate as described above.

Thus, the present disclosure is directed to application of the layer on many different LED chip arrangements. In other aspects, application of the layer on many different LED chip arrangements with the individual LED chips either coated by a converting phosphor or emitting light directly from their active region, are provided. In one alternative embodiment, a single or plurality of electrically connected LED chip circuits can comprise LED chips wherein all are coated with a single down-converting material. The mixed emission from the LED and the down-converting material can be cool or warm light. In one embodiment, all the LED chips emitter are blue LEDs covered with phosphor. In certain aspects, the phosphor can be incorporated into the layer and used in combination coated LED chips.

It is understood that the LED chips in the arrays including the layer as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

Another embodiment can comprise a single or plurality of connection LED circuits, with all the LED chips comprising LEDs being coated with and/or containing layer 36 comprising two or more down-converting materials like a phosphor. The combined LED and phosphor emission can cover different spectral ranges such as blue, green, yellow and red spectral ranges. The mixed emission can be cool or warm white light with a color point on the black body locus or within an 8-step Mac Adam ellipse thereof with high color rendering index of greater that 85. The phosphor composition can be for example selected from materials discussed above and/or combined with the layer.

In still other embodiments of an LED component according to the present disclosure can comprise a plurality of connection circuits comprising LED chips that emit light directly from their active region, with at least one circuit provided for red, green and blue emitting LEDs. In other embodiments connected LEDs circuits can also be added emitting cyan, yellow and/or amber. The LED component preferably emits a white light combination of light from the circuits that has a high color rendering index of greater than 85. The layer can comprise a plurality of highly reflective materials each of which is chosen to maximize reflection of a corresponding wavelength of light from such an array of LED chips. Likewise, the matrix of the layer can be chosen to maximize the transmission of the many wavelengths of light and/or to attenuate a predetermined wavelength(s) of light for a particular optical affect.

Still other embodiments can comprise different LED chips with LEDs emitting at different wavelengths. For example, in any of the LED chip configurations above in which at least one of the emitters comprises a short wavelength emitter in conjunction with one or more phosphor emitters, an ultraviolet emitting LED can be used as the LED. The matrix of the layer preferably is substantially transparent in the UV region associated with the ultraviolet emitting LED (e.g., polydimethylsiloxanes). This results in the predominant emission component of the LED chips coming from the phosphor excited by the ultraviolet LED. The phosphor emitter can be included in the matrix or applied to the package separately in combination with the layer. By way of example, each of the following phosphors exhibits excitation in the UV emission spectrum, provides a desirable peak emission, has efficient light conversion, and has acceptable Stokes shift, for example: Yellow/Green: $(Sr,Ca,Ba)(Al,Ga)_2S_4:Eu^{2+}$ $Ba_2(Mg,Zn)Si_2O_7:Eu^{2+}$ $Gd_{0.46}Sr_{0.31}Al_{1.23}O_xF_{1.38}:Eu^{2+}_{0.06}$ $(Ba_{1-x-y}Sr_xCa_y)SiO_4:EuBa_2SiO_4:Eu^{2+}$.

The LED components according to the present disclosure are particularly applicable to integration is solid state lighting luminares, and provide for surface mount or wire bond mounting in the luminares. The LED components provide an improvement in the lumens provided per cost, due to the reduced assembly requirements and footprint in luminaries along with reduced driver costs. The use of the layer in accordance with the present disclosure provides for improved luminous flux and can be achieved with low cost materials and minimum additional manufacturing costs.

Increasing Luminous Flux

Figure 19:
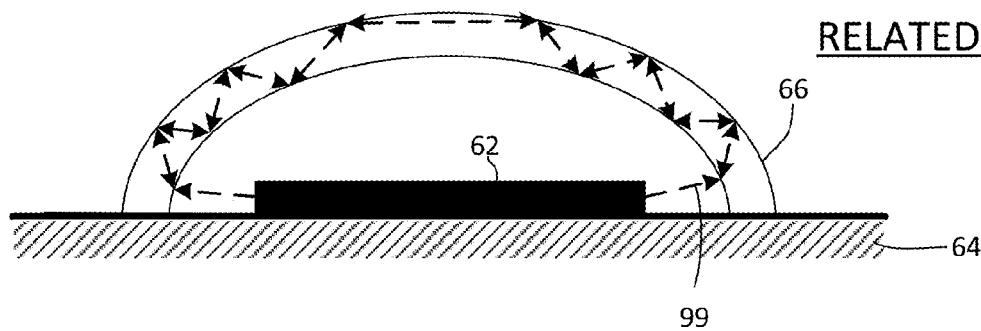
FIG. 19 is a sectional view of a conventional LED package schematically representing optical media internal reflection loss of edge-emitted light.
Figure 20:
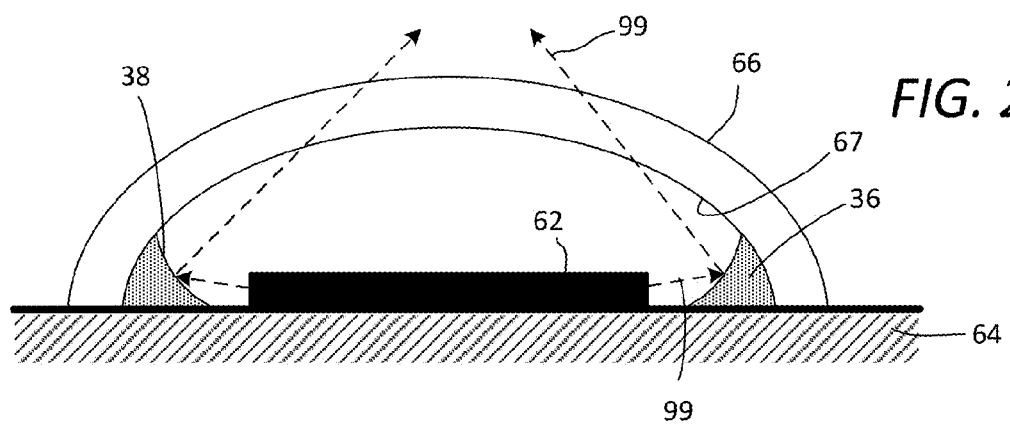
FIG. 20 is a sectional view of an embodiment of a LED package schematically representing reduction of optical media internal reflection loss of edge-emitted light according to the present disclosure.

As shown in FIG. 19, conventional LED packaging with configuration allowing side-emitted light 99 can suffer luminous losses by the internal reflection and/or absorption of light 99 by the optical media 66 in addition to absorption of emitted light by substrate or other components of the device. As shown in FIG. 20, the solid state lighting component including an embodiment of layer 36 configured with tapered surface 38 that contours at least a portion of interior surface 67 of optical media 66 can significantly increases the luminous efficacy of side-emitted light 99 than can escape the package as compared to a similar solid state lighting component without the presently disclosed layer, for example, as shown in FIG. 13. Similar results were observed or can be expected for various packages including packages having reflectors and the like.

As the layer is readily adaptable to a post-mounted, wire bonded LED package, with the layer being readily introduced to the LED edges, minimal modification to existing LED packaging manufacturing is needed. The methods according to the present disclosure are adaptable to monolithic LED structures with or without metal reflector elements and/or modification of the reflector.

The layer and methods of manufacturing, and methods of increasing the total luminous flux of a solid state lighting component are generally applicable to a variety of existing lighting components, for example, XM-L, ML-B, ML-E, MP-L EasyWhite, MX-3, MX-6, XP-G, XP-E, XP-C, MC-E, XR-E, XR-C, and XR LED packages, as well as DA, EZ, GaN, MB, RT, TR, UT, and XT chips manufactured by Cree, Inc. The benefits in luminous flux can be applied to many lighting applications, for example, commercial/retail display spotlights, LED retrofit bulbs, and other indoor and outdoor general-illumination applications.

The above has been described both generically and with regard to specific embodiments. Although the present disclosure has been set forth in what is believed to be the preferred embodiments, a wide variety of alternatives known to those of skill in the art can be selected within the generic disclosure. Other advantages and obvious modifications of the present disclosure will be apparent to the artisan from the above description and further through practice of the present disclosure.

We claim:

1. A solid state lighting component comprising:
   a substrate having a top surface, the top surface of the substrate comprising
      a first region comprising a die pad;
      a second region comprising a light absorbing feature, the second region being spaced apart from and within the first region of the top surface of the substrate; and
   a three dimensional near field reflective structure comprising a first shape positioned within the first region, the first shape at least partially surrounding the die pad, and a second shape positioned within the second region at least partially covering the light absorbing feature, the second shape positioned within the second region being spaced apart from the first shape;
   an LED element,
   wherein the first and the second shapes comprise polydimethylsiloxane, polyphenylsiloxane, or blends thereof, and an amount of titanium dioxide material sufficient for scattering and/or reflecting emitted light emitted from the LED element, reduce absorption of the emitted light, and combinations thereof,
   wherein the LED element is part of an array of LED elements, at least one of the first and the second shapes at least partially surrounding one or more individual LED elements of the array of LED elements and/or the array of LED elements,
   the polydimethylsiloxane, polyphenylsiloxane, or blends thereof being substantially transparent and substantially non-absorbing to light emitted by the LED element.

2. The solid state lighting component of claim 1, wherein the light absorbing feature is one or more of a wire trace, a wire bond, an Electrostatic Discharge Device (ESD), a solder mask, exposed surfaces of the substrate, and a heteroepitaxial layer on the substrate.

3. The solid state lighting component of claim 2, wherein the die pad is completely surrounded by the layer and the light absorbing feature is completely covered by the layer.

4. The solid state lighting component of claim 1, wherein the at least one of the first and the second shapes is arranged substantially polygonally and/or substantially annularly about the die pad.

5. The solid state lighting component of claim 1, wherein the LED element has side walls projecting from the substrate, the sidewalls supporting a top surface of the LED element having a height from the substrate; and the at least one of the first and the second shapes having at least a portion thereof with a height less than, equal to, or greater than the height of the top surface of the LED element.

6. The solid state lighting component of claim 1, further comprising an optical media having an exterior and an interior positioned about the LED element on the substrate.

7. The solid state lighting component of claim 6, wherein the at least one of the first and the second shapes at least partially surrounds the exterior of optical media adjacent the substrate.

8. The solid state lighting component of claim 6, wherein the interior of the optical media at least partially surrounds the at least one of the first and the second shapes.

9. The solid state lighting component of claim 1, wherein the at least one of the first and the second shapes has a first index of refraction between 1.4 and 1.5.

10. The solid state lighting component of claim 1, wherein the top surface of the substrate comprises aluminum nitride and the light absorbing feature comprises one or more electrostatic discharge devices (ESD's).

11. The solid state lighting component of claim 1, further comprising light absorbing particles capable of absorbing at least a portion of wavelength of light emitted by the LED.

12. The solid state lighting component of claim 11, wherein the at least one of the first and the second shapes comprises the light absorbing particles.

13. A solid state lighting component comprising an optical media;
   an array of LED elements; and
   a reflecting dam configured with a concave exterior surface; and a convex exterior surface that contours with at least a portion of an interior surface of the optical media, and the optical media is adjacent the convex exterior surface of the reflecting dam, the concave exterior surface of the reflecting dam configured for scattering and/or reflecting emitted light from one or more of the LED elements, the reflecting dam having a three dimensional structure at least partially surrounding one or more individual LED element of the array of LED elements, the reflecting dam comprising a polymer matrix of polydimethylsiloxane, polyphenylsiloxane, or blends thereof, and a titanium dioxide material, the polymer matrix being substantially transparent and substantially non-absorbing to light emitted by the LED element.

14. The solid state lighting component of claim 13, wherein the reflecting dam surrounds one or more individual LED elements of the array of LED elements along one or more sides of the individual LED element.

15. The solid state lighting component of claim 13, wherein the reflecting dam surrounds the array of LED elements.

16. The solid state lighting component of claim 13, wherein the reflecting dam surrounds one or more LED element of the array of LED elements and surrounds the array of LED elements.

17. The solid state lighting component of claim 13, wherein the reflecting dam surrounds each LED element of the array of LED elements and further surrounds the array of LED elements.

18. The solid state lighting component of claim 13, wherein the three dimensional structure of the reflective dam is discontinuous.

19. The solid state lighting component of claim 13, wherein the array of LED elements comprises a first set of one or more LED elements emitting light of a first color, and a second set of one or more LED elements emitting light of a second color.

20. The solid state lighting component of claim 13, wherein the reflective dam includes light absorbing material for absorbing emitted light from the one or more LED elements.

* * * * *